(12) United States Patent
Morita et al.

(10) Patent No.: US 7,842,755 B2
(45) Date of Patent: Nov. 30, 2010

(54) CURABLE ORGANOPOLYSILOXANE COMPOSITION, METHOD OF CURING THEREOF, SEMICONDUCTOR DEVICE, AND ADHESION PROMOTER

(75) Inventors: Yoshitsugu Morita, Ichihara (JP); Tomoko Kato, Ichihara (JP); Hiroshi Ueki, Ichihara (JP)

(73) Assignee: Dow Corning Toray Company, Ltd., Tokyo (JP)

( * ) Notice: Subject to any disclaimer, the term of this patent is extended or adjusted under 35 U.S.C. 154(b) by 436 days.

(21) Appl. No.: 11/572,660

(22) PCT Filed: Jul. 28, 2005

(86) PCT No.: PCT/JP2005/014354

§ 371 (c)(1),
(2), (4) Date: Sep. 7, 2007

(87) PCT Pub. No.: WO2006/011676

PCT Pub. Date: Feb. 2, 2006

(65) Prior Publication Data

US 2008/0262158 A1    Oct. 23, 2008

(30) Foreign Application Priority Data

Jul. 29, 2004  (JP) .............................. 2004-222072
Aug. 17, 2004  (JP) .............................. 2004-237719

(51) Int. Cl.
*C08L 83/05* (2006.01)
(52) U.S. Cl. .................. 525/100; 525/407; 526/194
(58) Field of Classification Search ................... 525/100
See application file for complete search history.

(56) References Cited

U.S. PATENT DOCUMENTS 4,657,986 A * 4/1987 Isayama et al. ............. 525/407
5,506,302 A * 4/1996 Shiono et al. ............... 524/731
5,510,181 A    4/1996 Nabata
6,235,857 B1 * 5/2001 Rizzardo et al. ............ 526/220

FOREIGN PATENT DOCUMENTS

| EP | 0596534 A2 | 5/1993 |
| JP | 08-291254 | * 11/1996 |
| WO | WO2004/037927 | 5/2004 |

OTHER PUBLICATIONS

English language abstract for JP6041563 extracted from espacenet.com Jan. 31, 2007.
English language abstract for JP6145525 extracted from espacenet.com Jan. 31, 2007.
English language translation and abstract for JP07283441 extracted from Searching PAJ, 15 pages.
English language translation and abstract for JP08291254 extracted from Searching PAJ, 24 pages.
English language translation and abstract for JP2000191914 extracted from Searching PAJ, 32 pages.
English language translation and abstract for JP2001168398 extracted from Searching PAJ, 16 pages.
English language translation and abstract for JP2001240750 extracted from Searching PAJ, 27 pages.
English language translation and abstract for JP2003147214 extracted from Searching PAJ, 29 pages.
English language abstract for JP2004143361 extracted from espacenet.com Jan. 31, 2007.

* cited by examiner

*Primary Examiner*—Ling-Siu Choi
*Assistant Examiner*—Chun-Cheng Wang
(74) *Attorney, Agent, or Firm*—Howard & Howard Attorneys PLLC (57) ABSTRACT

A curable organopolysiloxane composition comprising an organopolysiloxane containing alkenyl groups and phenyl groups, an organohydrogenpolysiloxane, a copolymer of a vinyl monomer and a vinyl monomer with hydrosilyl groups, and a platinum catalyst; a curing process that consists of two or more stages of thermal curing; an optical semiconductor device that has a light-transmitting portion made from a cured body of the aforementioned composition; and an adhesion promoter that consists of a copolymer of a vinyl monomer and a vinyl monomer with hydrosilyl groups.

16 Claims, 1 Drawing Sheet

CURABLE ORGANOPOLYSILOXANE COMPOSITION, METHOD OF CURING THEREOF, SEMICONDUCTOR DEVICE, AND ADHESION PROMOTER

RELATED APPLICATIONS

This application claims priority to and all the advantages of International Patent Application No. PCT/JP2005/014354, filed on Jul. 28, 2005, which claims priority to Japanese Patent Application No. JP 2004-222072, filed on Jul. 29, 2004 and Japanese Patent Application No. JP 2004-237719, filed on Aug. 17, 2004.

TECHNICAL FIELD

The present invention relates to a hydrosilation-curable organopolysiloxane composition, in particular, to a composition of the aforementioned type that, when cured, produces a cured body with high refractive index, light transmittance, and excellent adhesion to substrates with which it is in contact during curing. The present invention also relates to a method of curing of the aforementioned composition, and to a semiconductor device having a light-transmitting portion formed by a light-permeable cured body of the aforementioned curable organopolysiloxane composition. The present invention also relates to an adhesion promoter.

BACKGROUND ART

Until recently, there were many proposals aimed at improving adhesion of hydrosilation-curable organopolysiloxane compositions, mainly to metal and organic resin substrates, especially to those made from thermoplastic resins. In the past, methods of curing consisted of applying a silane-type primer onto the surface of an adherend, and then curing a hydrosilation-curable organopolysiloxane composition on the primed surface. However, since application of the primer onto the surface was associated with some difficulties, many suggestions were made to provide hydrosilation-curable organopolysiloxane compositions that acquire improved adhesiveness themselves due to introduction of adhesion promoters. Typical examples of such adhesion improvers are the following: an organic silicon compound having in one molecule an epoxy group and a hydrosilyl group (see JP Examined Patent Application Publication [hereinafter referred to as Kokoku] S53-13508); an organic silicon compound having in one molecule an alkoxysilyl group and a hydrosilyl group (see JP Kokoku S53-21026 and JP Kokoku S58-26376); an organic silicon compound having in one molecule a vinyl group and an alkoxy group (see JP Kokoku H6-41563); an organic silicon compound having in one molecule a vinyl group and an epoxy group (see JP Unexamined Patent Application Publication [hereinafter referred to as Kokai] H6-145525); a radical polymer of 3-methacryloxypropyl tris(dimethylhydrogensiloxy) silane, and a radical copolymer of the last-mentioned polymer and a vinyl monomer (e.g., methylmethacrylate or α-methylstyrene) (see JP Kokai H8-291254). Appropriate radical polymers and copolymers that contain hydrosilyl groups are known as adhesion promoters for curable organic resins that are free of alkenyl groups (see JP Kokai 2001-240750).

On the other hand, known in the art is a curable organopolysiloxane composition that consists of an organopolysiloxane with linear-chain alkenyl groups and aryl groups, an organopolysiloxane with branched alkenyl groups and aryl groups, an organohydrogenpolysiloxane with aryl groups, and a hydrosilation reaction catalyst. This curable organopolysiloxane composition is suitable for forming a cured body of high strength that has high light transmittance and can be used in semiconductor devices as a sealing agent (see JP Kokai 2004-143361). Also known are semiconductor devices wherein light-transmitting parts are made from a light-permeable silicone resin (see JP Kokai H7-283441 and JP Kokai 2001-168398).

However, although in the initial stage the self-adhesive hydrosilation-curable organopolysiloxane compositions of the type disclosed in aforementioned JP Kokoku S53-13508 to JP Kokai H6-145525 show excellent adhesion to metals and organic resins, and especially to thermoplastic resins with polar bonds, the adhesion of the adhesive substance to an organic resin, and especially to a thermoplastic resin with polar bonds is deteriorated when the adherend undergoes a wet or dry heat treatment. JP Kokai 2004-14336 does not give any hints to the possibility of adding an adhesion promoter disclosed in JP Kokoku S53-13508 to JP Kokai H6-145525. JP Kokai H8-291254 does not teach that a curable organopolysiloxane can be a material with improved light transmittance properties suitable for use as light-transmitting parts, especially in semiconductor devices. Furthermore, since preparation of the aforementioned radical polymer of 3-methacryloxypropyl tris(dimethylhydrogensiloxy) silane and the radical copolymer of the aforementioned silane and a vinyl monomer (e.g., methylmethacrylate or α-methylstyrene) is carried out without the use of a chain-transfer agent, it is difficult to control the degree of polymerization and to provide recovery of the adhesion promoter that is well compatible with the organopolysiloxane.

JP Kokai 2001-240750 does not teach that radical polymers and radical copolymers with appropriate hydrosilyl groups can be used as adhesion promoters for hydrosilation-curable organopolysiloxane compositions. Neither is it shown that an addition of the aforementioned radical polymers or copolymers to the curable organopolysiloxane composition disclosed in JP Kokai 2004-143361 can improve adhesion during curing of the composition not only to metals, inorganic semiconductors, and ceramics, but also to organic resins, especially to thermoplastic resins having polar bonds. JP Kokai H7-283441 and JP Kokai 2001-168398 only mention light-permeable silicone resins.

SUMMARY OF THE INVENTION

In view of the above, it is an object of the present invention to provide a curable organopolysiloxane composition that, when cured, produces a cured body with excellent initial adhesion and subsequent excellent endurance in adhesive connections not only to metals, inorganic semiconductors, ceramics, etc., but also to organic resins, in particular to thermoplastic resins with polar bonds with which the composition is in contact during curing, and with high refractive index and light transmitting properties.

It is a further object to provide a curing condition capable of imparting to a curable organopolysiloxane composition, when cured, excellent initial adhesion and subsequent excellent endurance in adhesive connections not only to metals, inorganic semiconductors, ceramics, etc., but also to organic resins, in particular to thermoplastic resins with polar bonds with which the composition is in contact during curing.

It is still another object to provide a semiconductor device having a light-transmitting part made from a cured body of a curable organopolysiloxane that is characterized by high refractive index and light transmitting properties, and that, when cured, can strongly adhere to various semiconductor elements and semiconductor materials (e.g., to resinous thermoplastic materials having polar bonds).

It is a further object to provide an adhesion promoter capable of imparting to a curable organopolysiloxane composition, when cured, excellent initial adhesion and subsequent excellent endurance in adhesive connections not only to metals, inorganic semiconductors, ceramics, etc., but also to organic resins, in particular to thermoplastic resins with polar bonds with which the composition is in contact during curing.

The present invention relates to:

[1] A curable organopolysiloxane composition comprising:
  100 parts by weight of (A) an organopolysiloxane represented by the average unit formula: $R_aSiO_{(4-a)/2}$ (where R designates an unsubstituted or halogen-substituted univalent hydrocarbon group with 1 to 10 carbon atoms, "a" is a positive number that satisfies the following condition: $0.5 \leq a \leq 2.2$, and no less than 20 mole % of all R's in one molecule are phenyl groups) that contains in one molecule at least two unsaturated aliphatic groups; (B) an organohydrogenpolysiloxane represented by the following average unit formula: $R^1_bH_cSiO_{(4-b-c)/2}$ (wherein $R^1$ designates an unsubstituted or halogen-substituted univalent hydrocarbon group with 1 to 10 carbon atoms, "b" and "c" are positive numbers that satisfy the following conditions: $0.002<c<1$; $1.0<b<2.2$; and $1.0<(b+c)<3.0$), that contains in one molecule at least two silicon-bonded hydrogen atoms (said component (B) being added in such an amount that the mole ratio of the silicon-bonded hydrogen atoms of component (B) to the unsaturated aliphatic groups of component (A) is within the range of 0.3 to 5);
  0.1 to 50 parts by weight of (C) a radical copolymer copolymerized from (a) a vinyl-type monomer that does not contain in its molecule an epoxy group, alkoxysilyl group, and a hydrosilyl group, (b) a vinyl-type monomer having in its molecule an epoxy group and/or an alkoxysilyl group but not having a hydrosilyl group, and (c) a vinyl-type monomer having in one molecule a hydrosilyl group, said radical copolymer being copolymerized in the presence of (d) a chain-transfer agent; and
  a catalytic quantity of (D) a hydrosilation catalyst.

[2] The curable organopolysiloxane composition of Item [1], wherein said component (A) comprises a mixture of (A1) an organopolysiloxane resin of an average unit formula: $R_aSiO_{(4-a)/2}$ (where R is the same as defined above, "a" is a positive number that satisfies the following condition: $1.9 \leq a \leq 2.2$, and no less than 20 mole % of all R's in one molecule are phenyl groups) that contains in one molecule at least two unsaturated aliphatic groups and has a viscosity at 25° C. within the range of 10 to 100,000 mPa·s, and (A2) a liquid organopolysiloxane resin of an average unit formula: $R_aSiO_{(4-a)/2}$ (where R is an unsubstituted or halogen-substituted univalent hydrocarbon group with 1 to 10 carbon atoms, "a" is a positive number that satisfies the following condition: $0.5 \leq a \leq 1.7$, and no less than 20 mole % of all R's in one molecule are phenyl groups), in said mixture constituent (A1) being added in the amount of 99 to 30 wt. %, and constituent (A2) being added in the amount of 1 to 70 wt. %.

[3] The curable organopolysiloxane composition of Item [1], wherein in component (B) more than 20 mole % of $R^1$ are phenyl groups.

[4] The curable organopolysiloxane composition of claim 1, wherein said vinyl-type monomer (c) having in one molecule a hydrosilyl group is represented by the following formula: $XSi[OSiH(R^3)_2]_g[OSi(R^3)_3]_h(R^4)_i$ (wherein X is a radical-polymerizable vinyl-bond-containing group, $R^3$ is an aryl group or alkyl group with 1 to 10 carbon atoms, $R^4$ is an alkoxy group, aryl group, or an alkyl group with 1 to 10 carbon atoms, "g" is an integer within the range of 1 to 3, "h" and "i" are integers within the range of 2 to 0, and $g+h+i=3$); and said chain-transfer agent (d) is a mercapto-containing organic silicon compound.

[5] The curable organopolysiloxane composition of Item [1], wherein (a) is a methacrylic acid alkyl ester, (b) is an epoxy-substituted alkyl ester of a methacrylic acid, and/or an alkoxysilyl alkyl ester of an acrylic acid, (c) is a compound, wherein one hydrogen atom in the alkyl group of the methacrylic acid alkyl ester is substituted with a group of the following formula: $-Si[OSiH(R^3)_2]_g[OSi(R^3)_3]_h(R^4)_i$ (where $R^3$, $R^4$, "g", "h", and "i" are the same as defined above), and said mercapto-containing organic silicon compound is a mercaptoalkylalkoxysilane.

[6] The curable organopolysiloxane composition of Item [5], wherein said methacrylic acid alkyl ester is a methacrylic acid n-butyl ester, said epoxy-substituted alkyl ester of a methacrylic acid is a glycidylmethacrylate, said alkoxysilyl alkyl ester of a methacrylic acid is a γ-methacryloxypropyl trialkoxysilane; said compound, wherein one hydrogen atom in the alkyl group of the methacrylic acid alkyl ester is substituted with a group of the following formula: $-Si[OSiH(R^3)_2]_g[OSi(R^3)_3]_h(R^4)_i$ is γ-methacryloxypropyl tri(dimethylhydrogensiloxy)silane, and said mercaptoalkylalkoxysilane is a γ-mercaptopropyl trialkoxysilane.

[7] The curable organopolysiloxane composition according to any of Items from [1] to [6], wherein the refractive index of said composition is no less than 1.45, and light transmittance in a cured body of the composition is within the range of 90 to 100%.

[8] A method of curing the curable organopolysiloxane composition as claimed in any of Items from 1 to 7 comprising a first stage of curing said curable organopolysiloxane composition to form an incompletely cured gel-like body and then a second stage for completing the curing operation by holding the obtained body at a higher temperature than the temperature at the first stage.

[9] The method of Item [8], wherein the heating condition in the first stage do not exceed 100° C.

[10] A semiconductor device, wherein a light-transmitting portion of said device is formed from a light-permeable cured body of a curable organopolysiloxane composition according to any of preceding Items from [1] to [7].

[11] An adhesion promoter that comprises a radical copolymer obtained by copolymerizing (a) a vinyl-type monomer that does not have in its molecule an epoxy group, alkoxysilyl group, and hydrosilyl group, (b1) a vinyl-type monomer having in its molecule an epoxy group but not having an alkoxysilyl group and a hydrosilyl group, (b2) a vinyl-type monomer having in its molecule an alkoxysilyl group, but not having an epoxy group and hydrosilyl group, and (c) a vinyl-type monomer having in its molecule a hydrosilyl group, said radical copolymer being copolymerized in the presence of (d) a mercapto-containing organic silicon compound.

[12] The adhesion promoter of Item [11], wherein the vinyl-type monomer (a) is a methacrylic acid alkyl ester, the vinyl-type monomer (b1) is an epoxy-substituted alkyl ester of a methacrylic acid, the vinyl-type monomer (b2) is an alkoxysilyl alkyl ester of a methacrylic acid, the vinyl-type monomer (c) is a compound, wherein one hydrogen atom in the alkyl group of the methacrylic acid alkyl ester is substituted with a group of the following formula: $-Si[OSiH(R^3)_2]_g[OSi(R^3)^3]_h(R^4)_i$ (where $R^3$, $R^4$, "g", "h", and "i" are the same as defined above) and wherein the mercapto-containing organic silicon compound is a mercaptoalkylalkoxysilane.

[13] The adhesion promoter of Item [12], wherein said methacrylic acid alkyl ester is a methacrylic acid n-butyl ester, said epoxy-substituted alkyl ester of a methacrylic acid is a glycidylmethacrylate, said alkoxysilyl alkyl ester of a methacrylic acid is γ-methacryloxypropyl trialkoxysilane, said compound, wherein one hydrogen atom in the alkyl group of the methacrylic acid alkyl ester is substituted with a group of the following formula: —Si[OSiH($R^3$)$_2$]$_g$OSi($R^3$)$_3$]$_h$($R^4$)$_i$; (where $R^3$, $R^4$, "g", "h", and "i" are the same as defined above) is a γ-methacryloxypropyl tris(hydrodimethylsiloxy)silane, and said mercaptoalkylalkoxysilane is a γ-mercaptopropyl trialkoxysilane.

The curable organopolysiloxane composition of the present invention, when cured, produces a cured body of excellent initial adhesion and subsequent excellent endurance in adhesive connections not only to metals, inorganic semiconductors, ceramics, etc., but also to organic resins, in particular to thermoplastic resins with polar bonds with which the composition is in contact during curing, and with a high refractive index and light transmitting properties. The method of the present invention for curing a curable organopolysiloxane composition imparts to a cured body of the aforementioned composition excellent initial adhesion and subsequent excellent endurance in adhesive connections not only to metals, inorganic semiconductors, ceramics, etc., but also to organic resins, in particular to thermoplastic resins with polar bonds with which the composition is in contact during curing.

A semiconductor device of the present invention has a light-transmitting part made from a cured body of a curable organopolysiloxane that is characterized by high refractive index and light transmitting properties, and that strongly adheres to various semiconductor elements and semiconductor materials (e.g., to resinous thermoplastic materials having polar bonds). An adhesion promoter of the present invention is capable of imparting to a curable organopolysiloxane composition, when cure, excellent initial adhesion and subsequent excellent endurance in adhesive connections not only to metals, inorganic semiconductors, ceramics, etc., but also to organic resins, in particular to thermoplastic resins with polar bonds with which the composition is in contact during curing.

BEST MODE FOR CARRYING OUT THE INVENTION

First, the present invention will be described with regard to the curable organopolysiloxane composition and adhesion promoter. Organopolysiloxane (A) that is represented by the average unit formula: $R_a SiO_{(4-a)/2}$ (where R designates an unsubstituted or halogen-substituted univalent hydrocarbon group with 1 to 10 carbon atoms, "a" is a positive number that satisfies the following condition: 0.5≦a≦2.2, and no less than 20 mole % of all R's in one molecule are phenyl groups) and contains in one molecule at least two unsaturated aliphatic groups is cured by a hydrosilation reaction with orga-nohydrogenpolysiloxane (B) represented by the following average unit formula: $R^1_b H_c SiO_{(4-b-c)/2}$ (wherein $R^1$ designates an unsubstituted or halogen-substituted univalent hydrocarbon group with 1 to 10 carbon atoms, "b" and "c" are positive numbers that satisfy the following conditions: 0.002<c<1; 1.0<b<2.2; and 1.0<(b+c)<3.0) that contains in one molecule at least two silicon-bonded hydrogen atoms. Curing is carried out with a catalytic action of hydrosilation catalyst (D).

Component (A) may have a linear, partially branched linear, branched, or a net-like molecular structure, but from the point of view of physical properties obtained in a cured body, it is preferable to have component (A) as an organopolysiloxane resin mixture composed of (A1) an organopolysiloxane of an average unit formula: $R_a SiO_{(4-a)/2}$ (where R is the same as defined above, "a" is a positive number that satisfies the following condition: 1.9≦a≦2.2, and no less than 20 mole % of all R's in one molecule are phenyl groups) that contains in one molecule at least two unsaturated aliphatic groups and has a viscosity at 25° C. within the range of 10 to 10,000,000 mPa·s, and (A2) an organopolysiloxane of an average unit formula: $R_a SiO_{(4-a)/2}$ (where R is an unsubstituted or halogen-substituted univalent hydrocarbon group with 1 to 10 carbon atoms, "a" is a positive number that satisfies the following condition: 0.5≦a≦1.7, and no less than 20 mole % of all R's in one molecule are phenyl groups). In the above mixture, constituent (A1) is added in the amount of 99 to 30 wt. %, and constituent (A2) is added in the amount of 1 to 70 wt. %. The most preferable proportions for the mixture is constituent (A1) in the amount of 90 to 40 wt. %, and constituent (A2) in the amount of 10 to 60 wt. % (of total 100 wt. %).

Constituent (A1) may have any molecular structure between linear and partially-branched linear structure. At room temperature, this constituent may be in any state between liquid state and gum state with a viscosity at 25° C. within the range of 10 to 10,000,000 mPa·s, preferably within the range of 100 to 1,000,000 mPa·s, and even more preferably, within the range of 100 to 100,000 mPa·s.

In the above formula, R may designate vinyl, allyl, propenyl, isopropenyl, butenyl, isobutenyl, hexenyl, cyclohexenyl, or a similar aliphatic unsaturated group (alkenyl group) with 2 to 8 carbon atoms; methyl, ethyl, propyl, isopropyl, butyl, isobutyl, t-butyl, pentyl, hexyl, cyclohexyl, heptyl, octyl, nonyl, decyl, or a similar alkyl group with 1 to 10, preferably 1 to 8 carbon atoms; phenyl, tolyl, xylyl, naphthyl, or a similar aryl group; benzyl, phenylethyl, or a similar aralkyl group; a halogenated alkyl group with 1 to 10, preferably 1 to 8 carbon atoms, e.g., a chloropropyl group, bromoethyl group, 3,3,3-trifluoropropyl group, etc., obtained by substituting a part of an alkyl group with a halogen atom, such as fluorine, chlorine, bromine, etc. Preferable is a combination of an alkyl group (especially, methyl group) with an alkenyl group (especially, vinyl group), and a phenyl group.

The following are specific examples of the aforementioned groups: A methylphenylpolysiloxane capped at both molecular terminals with dimethylvinylsiloxy groups, a copolymer of a methylphenylsiloxane and dimethylsiloxane capped at both molecular terminals with dimethylvinylsiloxy groups, a copolymer of methylvinylsiloxane and methylphenylsiloxane capped at both molecular terminals with dimethylvinylsiloxy groups, a copolymer of methylvinylsiloxane and diphenylsiloxane capped at both molecular terminals with dimethylvinylsiloxy groups, a copolymer of a methylvinylsiloxane, methylphenylsiloxane, and dimethylsiloxane capped at both molecular terminals with dimethylvinylsiloxy groups, a copolymer of a methylvinylsiloxane and methylphenylsiloxane capped at both molecular terminals with trimethylsiloxy groups, a copolymer of a methylvinylsiloxane and diphenylsiloxane capped at both molecular terminals with trimethylsiloxy groups, and a copolymer of a methylvinylsiloxane, methylphenylsiloxane, and dimethylsiloxane capped at both molecular terminals trimethylsiloxy groups.

Constituent (A2) may have any molecular structure between branched and net-like. At room temperature this component may be in any state from liquid to solid. The meaning of R in the formula of A2 is the same as defined above. In small quantities this constituent may contain silanol groups and alkoxy groups. Structural siloxane units may be exemplified by $R_3SiO_{1/2}$, $R_2SiO_{2/2}$, $RSiO_{3/2}$, $SiO_{4/2}$. The group $RSiO_{3/2}$ can be used independently or in combination with 1 to 3 other siloxane units. The group $SiO_{4/2}$ also may be combined with 1 to 3 other siloxane groups. In the aforementioned siloxane unit formulae, R is the same as defined above. A combination of alkyl groups (especially, methyl groups) with alkenyl groups (especially, vinyl groups), and phenyl groups is preferable.

In order to provide a cured body of the composition with a high physical strength and high refractive index, the content of phenyl groups in all R's of both constituents (A1) and (A2) should exceed 20 mole %, preferably 40 mole %.

Organohydrogenpolysiloxane (B) that is represented by the following average unit formula: $R^1{}_bH_cSiO_{(4-b-c)/2}$ (wherein $R^1$ designates an unsubstituted or halogen-substituted univalent hydrocarbon group with 1 to 10 carbon atoms, "b" and "c" are positive numbers that satisfy the following conditions: $0.002<c<1$; $1.0<b<2.2$; and $1.0<(b+c)<3.0$) that contains in one molecule at least two silicon-bonded hydrogen atoms is a cross-linking agent for component (A). When one molecule of component (A) contains two alkenyl groups, it is required that one molecule of component (B) contain at least three silicon-bonded hydrogen atoms. In the above formula, "c" satisfies the following condition: $0.002<c<1$. From the point of view of improved reactivity with component (A), the following condition is recommended: $0.02<c<1$.

There are no special limitations with regard to the molecular structure of component (B) that may have a linear, branched, or a net-like molecular structure. From the view point of good compatibility with component (A), it is recommended to have component (B) in a liquid form at room temperature. In the above formula, $R^1$ has the same meaning as the previously defined R, but preferable groups are alkyl groups (especially methyl groups) used alone or in combination with phenyl groups. Since an increase in the number of phenyl groups present in a molecule improves the refractive index and light-transmitting properties, it is recommended that in all $R^1$s the content of phenyl groups exceeds 20 mole %, and, preferably, exceeds 25 mole %.

Silicon-bonded hydrogen atoms of component (B) may be positioned at molecular terminals, inside the molecular chain, or in both positions. The number of silicon atoms in one molecule can be within the range of 3 to 500, preferably, within the range of 3 to 10. Viscosity of component (B) at 25° C. should be within the range of 1 to 1,000 mPa·s. From the point of view of high reactivity, it is recommended to have a viscosity of 1 to 50 mPa·s, preferably, 1 to 5 mPa·s.

Best results are obtained when component (B) is added in such an amount that the mole ratio of the silicon-bonded hydrogen atoms of component (B) to the unsaturated aliphatic groups of component (A) is within the range of 0.3 to 5, preferably 0.6 to 3. It is difficult to give an exact recommendation for a weight ratio between components (B) and (A), since such a ratio will depend on the molecular weight of component (B) and the amount of silicon-bonded hydrogen atoms in this component, as well as on the molecular weight of component (A) and the amount of unsaturated aliphatic groups in component (A). In general, however, it is recommended to add component (B) in the amount of 0.1 to 50 parts by weight per 100 parts by weight of component (A). If component (C) contains a large amount of silicon-bonded hydrogen atoms or if component (C) itself is added in a significant amount, the content of silicon-bonded hydrogen atoms of this component also has to be taken into account.

Component (C) is an adhesion promoter that is comprised of a radical copolymer consisting of a vinyl-type monomer (a) that does not contain in its molecule an epoxy group, alkoxysilyl group, and a hydrosilyl group, a vinyl-type monomer (b) having in its molecule an epoxy group or an alkoxysilyl group but not having a hydrosilyl group, and a vinyl-type monomer (c) having in one molecule a hydrosilyl group. The aforementioned radical copolymer is copolymerized in the presence of a chain-transfer agent (d). Component (C) has an epoxy group and/or alkoxysilyl group and hydrosilyl group bonded to a side chain of a vinyl-type oligomer or a vinyl-type polymer directly or via a connecting group. It can be assumed that residual radicals of the chain-transfer agent may be bonded to the molecular terminals of the aforementioned vinyl-type polymer or oligomer. The presence of component (C) in the curable organopolysiloxane composition of the present invention improves endurance of adhesion to various substrates with which the composition is in contact during curing.

The following are examples of monomer (a): methyl acrylate, methyl methacrylate, ethyl acrylate, ethyl methacrylate, n-propyl acrylate, n-propyl methacrylate, isopropyl acrylate, isopropyl methacrylate, n-butyl acrylate, n-butyl methacrylate, isobutyl acrylate, isobutyl methacrylate, t-butyl acrylate, t-butyl methacrylate, or similar lower alkylacrylates or methacrylates; n-hexyl methacrylate, cyclohexyl acrylate, 2-ethylhexyl acrylate, octyl acrylate, lauryl acrylate, stearyl acrylate, or similar higher alkyl acrylates or methacrylates; vinyl acetate, vinyl propionate, vinyl butyrate, vinyl caproate, or similar lower fatty acid vinyl esters; vinyl 2-ethylhexanoate, vinyl laurate, vinyl stearate, or similar higher fatty acids vinyl esters; styrene, vinyl toluene, vinyl pyrrolidone; benzyl acrylate, benzyl methacrylate, phenoxyethyl acrylate, phenoxyethyl methacrylate, or similar aryl-containing acrylates or methacrylates; acrylamide, methacrylamide, N-methylol acrylamide, N-methoxymethyl acrylamide, N-methoxymethyl methacrylamide, isobutoxymethoxy acrylamide, isobutoxymethoxy methacrylamide, N,N-dimethyl acrylamide, N,N-dimethyl methacrylamide, or similar acrylamides, methacrylamides, or their derivatives; 2-hydroxyethyl acrylate, 2-hydroxyethyl methacrylate, 2-hydroxypropyl acrylate, 2-hydroxypropyl methacrylate, 2-hydroxybutyl acrylate, 2-hydroxybutyl methacrylate, or similar hydroxyalkyl acrylates or methacrylates; acrylic acid, methacrylic acid, itaconic acid, crotonic acid, fumaric acid, maleic acid, or similar unsaturated aliphatic carboxylic acids; tetrahydrofurfuryl acrylate, tetrahydrofurfuryl methacrylate, butoxyethyl acrylate, butoxyethyl methacrylate, ethoxydiethyleneglycol acrylate, ethoxydiethyleneglycol methacrylate, polyethyleneglycol acrylate, polyethyleneglycol methacrylate, polypropyleneglycol monoacrylate, polypropyleneglycol monomethacrylate, or similar alkoxylated acrylates or methacrylates; hydroxybutylvinyl ether, cetylvinyl ether, 2-ethylhexylvinyl ether, or similar vinyl ethers; dimethylaminoethyl acrylate, dimethylaminoethyl methacrylates, diethylaminoethyl acrylates, diethylaminoethyl methacrylates, or similar aminoalkyl acrylates or methacrylates; trifluoropropyl acrylate, trifluoropropyl methacrylate, perfluorobutylethyl methacrylate, perfluorobutylethyl acrylate, perfluorooctylethyl methacrylate, or similar fluorinated acrylates or methacrylates; butadiene, isoprene, or similar dienes; vinyl chloride, vinylidene chloride, or similar chlorinated vinyl-type monomers; acrylonitrile, or similar tolyl-type monomers; diorganopolysiloxanes having on one molecular terminals an acrylic or methacrylic group, a styrene group or a similar radical-polymerizable functional group; dibutyl fumarate; anhydrous maleic acid; dodecyl anhydrous maleic acid; dodecyl anhydrous succinic acid; styrene sulfonic acid, or similar unsaturated aliphatic sulfonic acids; and alkali metal salts, ammonium salts, or organic amine salts of the aforementioned compounds; 2-hydroxy-3-methacryloxypropyl trimethylammonium chloride, or similar quaternary ammonium salts derived from a methacrylic acid; methacrylic acid esters of tertiary alcohol such as methacrylic acid diethylaminoethanol ester, as well as their quaternary ammonium salts.

Monomer (a) may also be represented by polyfunctional vinyl monomers, such as allyl methacrylate, allyl metametacrylate, or similar alkenyl acrylates or methacrylate; trimethylolpropane triacrylate, trimethylolpropane trimethacrylate, pentaethylhritol acrylate, pentaethylhritol methacrylate, ethyleneglycol diacrylate, ethyleneglycol dimethacrylate, tetraethyleneglycol diacrylate, ethyleneglycol dimethacrylate, polyethyleneglycol diacrylate, polyethyleneglycol dimethacrylate, 1,4-butadioldiacrylate, 1,4-butadiol dimethacrylate, 6-hexadiol diacrylate, 1,6-hexadiol dimethacrylate, neopentylglycol diacrylate, neopentylglycol dimethacrylate, trimethylolpropane trioxyethylacrylate, trimethylolpropane trioxyethylmethacrylate, tris(2-hydroxyethyl) isocyanurate diacrylate, tris(2-hydroxyethyl) isocyanurate dimethacrylate, tris(2-hydroxyethyl) isocyanurate triacrylate, tris(2-hydroxyethyl) isocyanurate trimethacrylate, acrylate or methacrylate of diol of adduct of ethyleneoxide or propyleneoxide with bisphenol A, adduct of ethyleneoxide or methyleneoxide with hydrogenised bisphenol A, diacrylate or dimethacrylate of diol, methacryloxypropyl-containing polydimethyloxane, triethyleneglycol divinyl ether, and styrene-containing polydimethyl siloxane.

Vinyl-type monomer (b) that contains in its molecule an epoxy group or alkoxysilyl group but does not contain a hydrosilyl group may be exemplified by glycidylacrylate, 3,4-epoxycyclohexylmethyl acrylate, 3,4-epoxycyclohexylmethyl methacrylate, or similar epoxy-containing alcohol esters; methacryloxyalkyl alkoxysilanes of the following general formula: $CH_2=C(R^5)C(=O)OR^7—Si(OR^6)_jR^8_k$, alkenylalkoxysilane with 2 to 10 carbon atoms represented by the following general formula: $CH_2=CH—Si(OR^6)_aR^8_b$, or $CH_2=CHR^7—Si(OR^6)_jR^8_k$, alkoxysilane having a styril group represented by the general formula: $CH_2=C(R^5)$-Ph$(R^6)_e—(R^7)_f—$; and alkoxysilane having a styril group-bonded alkyl group (in the aforementioned formulae, $R^5$ is a hydrogen atom or methyl group, Ph is a phenylene group, $R^6$ is an alkyl group with 1 to 10 carbon atoms, $R^7$ is an alkylene group with 1 to 10 carbon atoms, and $R^8$ is an alkyl group with 1 to 10 carbon atoms or a phenyl group; "j" is an integer of 1 to 3, "k" is an integer of 2 to 0, j+k=3, "e" is an integer of 0 to 4, "f" is 0 or 1).

The following are specific examples of the aforementioned compounds: 3-methacryloxypropyl trimethoxysilane, 3-methacryloxypropyl trimethoxysilane, 3-methacryloxypropyl dimethoxymethyl silane, 3-methacryloxypropyl diethoxymethyl silane, 3-acryloxypropyl trimethoxysilane, or similar methacryloxyalkyl alkoxysilanes; 3-methacrylamidepropyl trimethoxysilane, 2-acrylamidepropyl trimethoxysilane, or similar methacrylamidealkyl alkoxysilanes; vinyl trimethoxysilane, allyl trimethoxysilane, vinyl trimethoxysilane, hexenyl trimethoxysilane, or similar alkenylalkoxysilanes; p-styryl trimethoxysilane, 2-(p-styryl) ethyl trimethoxysilane, 3-vinylphenyl trimethoxysilane, 4-(2-propenyl)phenyl trimethoxysilane, 3-(2-propenyl)phenyl trimethoxysilane, 2-(4-vinylphenyl)ethyltrimethoxysilane, 2-(3-vinylphenyl)ethyltrimethoxysilane, or similar alkenylphenyl alkoxysilanes. The most suitable for use, from the point of view of good compatability with component (A) and improved transparency of a cure body obtained from the composition of the present invention, is a radical copolymer of the aforementioned monomer having epoxy-containing alkoxysilyl groups and not having alkoxysilyl and hydrosilyl groups with a monomer having alkoxysilyl groups and not having epoxy and hydrosilyl groups.

(C) Radical copolymer from (a) a vinyl-type monomer that does not contain in it molecule an epoxy group, alkoxysilyl group, and a hydrosilyl group, (b1) a vinyl-type monomer having in its molecule an epoxy group but not having an alkoxysilyl and hydrosilyl group, (b2) a vinyl-type monomer having in its molecule an alkoxysilyl group but not having an epoxy group and hydrosilyl group, and (c) a vinyl-type monomer having in it molecule a hydrosilyl group in the presence of (d) a mercapto-containing organic silicon compound as a chain-transfer agent, is useful as adhesion promoters for curable organopolysiloxane compositions, organic resin compositions, rubber compositions, etc.

Vinyl-type monomer (c) that contains in its molecule a hydrosilyl group is represented by the following formula: $XSi[OSiH(R^3)_2]_g[OSi(R^3)_3]_h (R^4)_i$ (wherein X is a radical-polymerizable vinyl-bond-containing group, $R^3$ is an aryl group with 6 to 10 carbon atoms or alkyl group with 1 to 10 carbon atoms, $R^4$ is an alkoxy group, aryl group with 6 to 10 carbon atoms, or an alkyl group with 1 to 10 carbon atoms, "g" is an integer within the range of 1 to 3, "h" and "i" is an integer within the range of 2 to 0, and g+h+i=3). In the above formula, $R^3$ may designate an aryl group with 6 to 10 carbon atoms or alkyl group with 1 to 10 carbon atoms. The alkyl group can be exemplified by methyl, ethyl, propyl, butyl, pentyl, isopropyl, isobutyl, cyclopentyl, and cyclohexyl group. The aryl group can be exemplified by a phenyl and naphthyl group. Most preferable is a methyl group, and then phenyl group. $R^4$ may designate an aryl or alkoxy, and alkyl group with 1 to 10 carbon atoms. The alkyl group can be represented by methyl, ethyl, propyl, butyl, pentyl, isopropyl, isobutyl, cyclopentyl, and cyclohexyl group, of which most preferable is the methyl group. The aryl group can be represented by phenyl and naphthyl group. The alkoxy group can be represented by methoxy, ethoxy, propoxy, pentoxy, isopropoxy, isobutoxy, cyclopentyloxy, and cyclohexyloxy group, of which most preferable is the methoxy group.

In the above formula, X is a radical-polymerizable vinyl-bonded group, e.g., a methacryloxy alkyl group of the following formula: $CH_2=C(R^5)C(=O)OR^7—$, an acrylamido alkyl group of the following formula: $CH_2=C(R^5)C(=O)NHR^7—$; a styryl group bonded alkyl group or styryl group of the following general formula: $CH_2=C(R^5)$-Ph$(R^6)_e—(R^7)_f—$, a vinyl group or an alkenyl group having 3 to 12 carbon atoms and represented by the following general formula: $CH_2=CHR^7—$ (where $R^5$ is a hydrogen atom or a methyl group, Ph is a phenylene group, $R^6$ is an alkyl group with 1 to 10 carbon atoms, and $R^7$ is an alkylene group with 1 to 10 carbon atoms; "e" is an integer of 0 to 4, and "f" is 0 or 1). The aforementioned radical-polymerizable vinyl-bonded groups can be exemplified by 1-acryloxymethyl group, 3-acryloxypropyl group, 1-methacryloxymethyl group, 3-methacryloxypropyl group, 4-vinylphenyl group, 4-(2-propenyl)phenyl group, 3-(2-propenyl)phenyl group, 2-(4-vinylphenyl)ethyl group, 2-(3-vinylphenyl)ethyl group, vinyl group, allyl group, methallyl group, and 5-hexenyl group.

The aforementioned vinyl-type monomers (c) may be exemplified by compounds having chemical structures shown by the below-given formulae, where Me stands for methyl group, and Ph stands for phenylene group:

$CH_2=C(Me)C(=O)OC_3H_6-Si(OSiHMe_2)_3$ $CH_2=CHC(=O)OC_3H_6-Si(OSiHMe_2)_3$ $CH_2=C(Me)C(=O)OC_3H_6-Si(OSiHMe_2)_2(OSiMe_3)$ $CH_2=CHC(=O)OC_3H_6-Si(OSiHMe_2)_2(OSiMe_3)$ $CH_2=C(Me)C(=O)OC_3H_6-Si(OSiHMe_2)(OSiMe_3)_2$ $CH_2=CHC(=O)OC_3H_6-Si(OSiHMe_2)(OSiMe_3)_2$ $CH_2=C(Me)C(=O)OC_3H_6-Si(OSiHMe_2)Me_2$ $CH_2=C(Me)C(=O)OC_3H_6-Si(OSiHMe_2)_2(OMe)$ $CH_2=CHPh-Si(OSiHMe_2)_3$ $CH_2=CHPh-SiC_2H_4(OSiHMe_2)_3$ $CH_2=C-Si(OSiHMe_2)_3$ $CH_2=CHC_3H_6-Si(OSiHMe_2)_3$ $CH_2=CH-Si(OSiHMe_2)_2(OSiMe_3)$

The dimethylpolysiloxanes may have methacryloxy groups, acryloxy groups, styryl groups, alkenyl groups, or similar radical polymerizable vinyl-bonded groups at molecular terminals, and silicon-bonded hydrogen atoms at terminals or in side positions.

Copolymerization of aforementioned vinyl-type monomers (a), (b), and (c) together with chain transfer agent (d) improves reproducibility of the radical copolymer and makes it possible to obtain it with a predetermined degree of polymerization. For better properties, it is recommended to use a mercapto-containing organic silicon compound or an organic mercaptane. It can be assumed that bonding of mercapto groups to the molecular terminals of the radical copolymer makes it possible to control the degree of polymerization of the aforementioned radical copolymer.

The organic silicon compound that contains a mercapto group can be represented by 3-mercaptopropyl trimethoxysilane, 3-mercaptopropyl triethoxysilane, 3-mercaptopropyl dimethoxymethylsilane, 3-mercaptopropyl methoxydimethylailane, or similar mercaptoalkyl alkoxysilane; mercaptopropyl tri(hydrodimethylsiloxy)silane, 3-mercaptopropyl (hydrodimethylsiloxy)methylsilane, or a similar mercaptoalkoxy (hydrodialkylsiloxy)silane. The organic mercaptan can be exemplified by 2-mercaptoethanol, butylmercaptan, hexylmercaptan, and n-dodecylmercaptan. Methyl chloride, chloroform, carbon tetrachloride, butyl bromide, 3-chloropropyl trimethoxysilane, or similar halides also may be used as chain-transfer agents. Most preferable from the point of view of improved adhesion are organic silicon compounds that contain a mercapto group, especially, mercaptoalkyl alkoxysilane and mercaptoalkyl (hydrodialkylsiloxy)silane.

Component (C) is produced by radical copolymerizing the aforementioned vinyl-type monomers (a), (b), and (c) in the presence of the organic silicon compound (d) that contains a mercapto group.

For copolymerization, the aforementioned vinyl-type monomers (a), (b), and (c) are added in the following proportions: (a) 10.0 to 70.0 mole %, preferably 15.0 to 56.0 mole %, (b) 20.0 to 70.0 mole %, preferably, 30.0 to 50.0 mole %, (c) 5.0 to 70.0, preferably 10.0 to 55.0 (total 100 mole %).

Radical polymerization may be carried out with or without the presence of an organic solvent. In the case of an organic solvent, the process is carried out for 3 to 20 hours at a temperature of 50 to 150° C. in the presence of a radical initiator. The organic solvent may be exemplified by hexane, octane, decane, cyclohexane, or a similar aliphatic hydrocarbon; benzene, toluene, xylene, or similar aromatic hydrocarbons; diethylether, dibutylether tetrahydrofuran, dioxane, or similar ethers; acetone, methylethylketone, methylisobutylketone, diisobutylketone, or similar ketones; methyl acetate, butyl acetate, isobutyl acetate, or similar esters; methanol, ethanol, isopropanol, butanol, or similar alcohols. Most preferable are toluene or xylene. Radical initiators may be those conventionally used for this purpose, e.g., 2,2'-azobis(isobutylonitrile), 2,2'-azobis(2-methylbutylonitrile), 2,2'-azobis(2,4-dimethylvaleronitrile), or similar azobis compounds; benzoyl peroxide, lauroyl peroxide, tert-butylperoxybezoate, tert-butylperoxy-2-ethylhexanoate, or similar organic peroxides. The aforementioned radical initiators can be used individually or in combinations of two or more. They are added in an amount of 0.1 to 6 parts by weight per 100 parts by weight of the sum of aforementioned constituents (a), (b) and (c).

From the point of view of better dispersion in components (A) and (B), it is preferable to have component (C) in a liquid state at room temperature. Its molecular weight should be within the range of 500 to 5,000, preferably 700 to 3,000, and viscosity should be within the range of 500 to 1,000,000 mPa·s.

It is recommended to add component (C) in the amount of 0.1 to 50 parts by weight, preferably 0.5 to 20 parts by weight per 100 parts by weight of component (A). The amount of component (C) to be added to the composition may vary depending on its molecular weight and amount of alkoxysilyl and hydrosilyl groups in its molecule, but, in any case, if it is added in the amount of less than 0.1 parts by weight, it would be difficult to provide good adhesion to a substrate with which the composition is in contact during curing. On the other hand, if the added amount of component (C) exceeds 50 parts by weight, this will lower heat-resistant properties and physical strength of the cured body.

Hydrosilation catalyst (D) accelerates a hydrosilation reaction between the silicon-bonded unsaturated aliphatic groups of component (A) and silicon-bonded hydrogen atoms of component (B) and cures the composition by cross-linking components (A) and (B). A preferably hydrosilation catalyst is a platinum type metal catalyst, such as platinum black, chloroplatinic acid, alcohol-denatured chloroplatinic acid, a complex of diolefin and chloroplatinic acid, platinum bis (acetylacetonate), a complex of chloroplatinic acid and divinyltetramethyldisiloxane, a complex of platinum and divinylteramethyldisiloxane, a complex of chloroplatinic acid and acetylene alcohol etc. Other catalysts may be exemplified by a Wilkinson's catalyst, or similar rhodium or ruthenium compounds, but platinum-type compounds are preferable as they are less expensive. The hydrosilation catalyst is added in an amount selected depending on desired rate of curing, but in general the platinum metal type catalyst should be added in the amount of 1 to 2,000 ppm, preferably 1 to 200 ppm, per total weight of components (A), (13), and (C).

The presence of hydrosilation catalyst (D) accelerates cross-linking of components (A) and (B), even at room temperature, but in order to extend the time when curing is carried out at room temperature or to shorten the time of curing when curing is carried out with heating, it is recommended to add to the composition (E) an addition-reaction controller that can be selected, e.g., from tetramethyltetravinylcyclotetrasiloxane, triallylisocyanurate, alkylmaleate, acetylene alcohol, enyne compound, alkynylalkoxysilane, alkynylalkoxysiloxane, hydroperoxide, tetramethylethylenediamine, benzotriazole, etc. These compounds should be added in the amount of 0.001 to 6 parts by weight per 100 parts by weight of the sum of components (A), (B), and (D).

Within the limits that are not in contradiction with the objects of the present invention, the curable organopolysiloxane composition may be combined with some arbitrary components, such as a silica filler, quartz powder, alumina powder, or a similar inorganic filler; a polymethacrylate resin, or a similar fine organic powder; a pigment, heat-resistant agent, flame retarder, solvent, etc.

At room temperature, the curable organopolysiloxane of the present invention may be in a state between liquid and gum-like. It may be flowable at room temperature or when heated. Heating accelerates curing of the composition. Measurement of hardness with a type A durometer according to JIS K 6253 shows that the cured body is an elastomer with a hardness of 15 to 80. Since the composition demonstrates excellent endurance of adhesion to substrates with which it is in contact during curing, such as thermoplastic resins with polar bonds, thermosetting resins, or similar organic resins, metals, inorganic semiconductors, ceramics, and glass, the composition is suitable for use in conjunction with electrical devices, electronic parts, electronic instruments, electrical parts, etc., as a sealant, adhesive agent, potting agent, protective coating agent, underfill agent, etc. The curable organopolysiloxane of the present invention of which cured body has a refractive index of 1.45 or more, and preferably, 1.50 or more, and has a light transmittance of 90 to 100%, is useful as light-permeable sealants, adhesives, potting agents, protective coating agents, and underfill agents for use in optical semiconductor elements and optical semiconductor components.

The following description will relate to a method of curing according to the present invention. The method consists of curing the curable composition of the present invention, first incompletely, to a gel state and then to a completely cured state by retaining it at a high temperature. The thermal curing process of the present invention may be carried out with two or more stages. In the first stage, curing may be performed at the lowest possible temperature required to initiate curing of the aforementioned curable organopolysiloxane. In order to alleviate internal stress, it is recommended to maintain the curing temperature at the first state below 100° C. This allows curing of the composition to a non-flowable gel state. In the second stage, the temperature is higher than in the first step and maintained till complete curing of the composition. The second stage temperature is within the range of 120 to 180° C. The second stage curing decreases the internal stress that could be developed during curing of the aforementioned curable organopolysiloxane and improves both the initial adhesive strength between the cured body and a substrate, e.g., an organic resin substrate and the subsequent adhesion endurance.

The following description will relate to a semiconductor device of the present invention.

A semiconductor device of the present invention is characterized by the fact that its light transmitting part is formed from a light-permeable cured body obtained from the curable organopolysiloxane composition of the present invention. The semiconductor elements of the device are sealed with the aforementioned light-permeable cured body. Such optical semiconductor elements may comprise light-generating as well as light-receiving elements. Typical examples of optical semiconductor elements are LED chips, wherein light-generating layers are formed as semiconductor such as InN, AlN, GaN, ZnSe, SiC, GaP, GaAs, GaAlAs, GaAlN, AlInGaP, InGaN, AlInGaN, etc., deposited onto substrates by growing from a liquid phase or by a MOCVD process. For example, a semiconductor device of the present invention may comprise a surface-mounted type light-emitting diode (LED). The optical semiconductor device is placed into a casing having a recessed cross section and made from a thermoresistive organic resin, such as polyphthalamide, polyphenylene sulfate, or polyethernitrile resin. The casing is then filled with the curable organopolysiloxane that is cured and thus seals the semiconductor element (LED) of the device with a cured light-transmitting body of the aforementioned composition. The composition that is used in this case is formed into an elastomer with a hardness that, when measured by Type A durometer according to JIS K 6253, is within the range of 15 to 50. The composition strongly and durably adheres to heat-resistant organic resin substrate, optical semiconductor elements (e.g., LED chips), inner electrodes (inner leads), bonding wires, and other elements with which it is in contact during curing. The LED's may be of a bullet type. Examples of other semiconductor devices of the present invention include photocouplers and CCD's.

Figure 1:
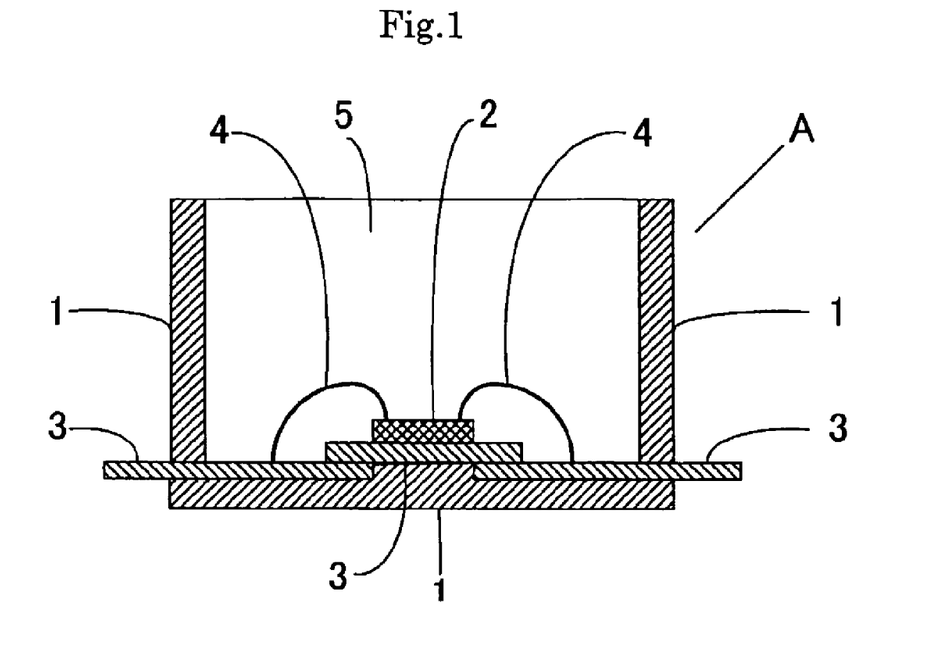
FIG. 1 is a sectional view of a light-emitting diode (LED) A of a surface-mounted type as an example of an optical semiconductor device of the present invention, where A is the light-emitting diode (LED) of a surface-mounted type, 1 is the polyphthalamide (PPA) resin case, 2 is the LED chip, 3 is the inner lead, 4 is the bonding wire, and 5 is the cured body of a curable organopolysiloxane composition.

As has been mentioned, a LED may be of a bullet type or a surface-mounted type, but the LED shown in FIG. 1 and designated by A relates to the last-mentioned type. The device has a casing 1 made from a polypthalamide (PPA) resin with inner leads 3 that face the bottom of the casing recess and extend from the center of the casing outward beyond the side walls of the casing. A LED chip 2 is placed onto the central part of the inner lead. The LED chip 2 and the inner leads 3 are electrically connected via bonding wires 4. The interior of the PPA resin casing 1 is filled with the curable organopolysiloxane composition that was used in the subsequent practical examples. The composition was cured with heating and formed a light-permeable cured body 5.

EXAMPLES

The curable organopolysiloxane composition of the present invention, method of curing thereof, and the semiconductor device produced with the use of the composition will now be described in more detail with reference to practical and comparative examples. The values of viscosity shown in the practical and comparative examples were measured at 25° C. Characteristics of the curable organopolysiloxane composition and cured body were measured by the methods described below. The method for evaluating manufacturing of the surface-mounted type LED and peelability of the cured body obtained by curing the aforementioned curable organopolysiloxane composition are also described below.

[Refractive Index of the Curable Organopolysiloxane]

The refractive index of the curable organopolysiloxane composition was measured at 25° C. with the use of an Abbe refractometer with a light source of a visible light of 589 nm.

[Light Transmittance of Cured Body of the Curable Organopolysiloxane Composition]

The curable organopolysiloxane composition was retained for 1 hour between two glass plates and cured (optical path length of 0.2 mm). Light transmittance was measured at 25°

C. with the use of a recording spectrophotometer at an arbitrary wavelength of visible light within the range of 400 nm to 700 nm. Light transmittance of the cured body was determined as a difference between light transmittance of the glass plates only and the glass plates with the cured composition between them. Light transmittances shown in Table 5 were measured with the light of 450 nm.

[Hardness of Cured Body of the Curable Organopolysiloxane Composition]

A sheet-like cured body of the curable organopolysiloxane composition was produced by subjecting the composition to 1 hour press forming at 150° C. The hardness of the obtained product was measured by Type A durometer in accordance with JIS K 6253.

[Tensile Strength and Elongation of a Cured Body of the Curable Organopolysiloxane Composition]

A cured body in the form of a dumbell No. 3 specimen according to JIS K 6251 was produced by pressure molding the curable organopolysiloxane composition for 1 hour at 150° C. Tensile strength of the obtained cured body was measured according to JIS K 6251.

[Tear Strength of the Cured Body of the Curable Organopolysiloxane Composition]

A crescent-shaped cured body of the curable organopolysiloxane composition corresponding to JIS K 6252 was produced by subjecting the composition to 1 hour press forming at 150° C. The obtained test piece was measured according to JIS K 6252 with regard to tear strength.

[Adhesion of the Cured Body of the Curable Organopolysiloxane to the Plate of Polyphthalamide (PPA)]

A (10 mm wide, 20 mm long, and 1 mm thick) polytetrafluoroethylene resin spacer was sandwiched between two (25 mm wide, 50 mm long, and 1 mm thick) polyphthalamide (PPA) resin plates. The remaining space was filled with the curable organopolysiloxane, the unit was fixed with a clip, and the composition was cured at 150° C. for 1 hour in a hot-air circulation oven. The clip and spacer were removed, and the stress developed at rupture was measured with a tensile strength tester by pulling the aforementioned polyphthalamide (PPA) resin plates in opposite horizontal directions.

[Adhesive Force of the Curable Organopolysiloxane Composition to an Aluminum Plate]

A (10 mm wide, 20 mm long, and 1 mm thick) polytetrafluoroethylene resin spacer was sandwiched between two (25 mm wide, 75 mm long, and 1 mm thick) aluminum plates. The remaining space was filled with the curable organopolysiloxane, the unit was fixed with a clip, and the composition was cured at 150° C. for 1 hour in a hot-air circulation oven. The unit was cooled to room temperature, the clip and spacer were removed, and the stress developed at rupture was measured with a tensile strength tester by pulling the aforementioned aluminum plates in opposite horizontal directions.

[Manufacturing of the Surface-Mounted Type LED]

Each preliminarily defoamed curable organopolysiloxane composition used in the below-described practical and comparative examples was poured into PPA resin casing 1 in which inner leads 3 were placed onto the central parts of the bottoms of the closed-bottom cylindrical casing 1 (inner diameter 2.0 mm, depth 1.0 mm) made from a polyphthalamide resin (PPA) so that the ends of the leads extended from the side wall of the said casing. LED chip 2 was placed onto the inner leads 3 in the central parts of the said casing, and the LED chip 2 was electrically connected to the inner leads 3 by bonding wires 4 with a dispenser, and cured for 1 hour at first stage curing temperatures and second stage curing temperatures shown in below-given Tables 5, 6. 8, 13, 14, and 16. As a result, 16 samples of surface-mounted LED's of the type shown in FIG. 1 and designated by symbol A were produced.

[Rate of Peeling of Cured Bodies at the Initial Stage]

Rate of peeling on all 16 samples of the surface-mounted LED's A was determined by observing the peeling conditions between the bottom wall of the PPA resin casings 1 and the aforementioned thermally cured bodies of the compositions under an optical microscope.

[Rate of Peeling after Maintaining the Samples in Constant Temperature and Constant Humid Conditions]

All 16 surface-mounted type LED's A were held for 72 hours in air at 30° C./70% RH, then the room temperature conditions (25° C.) were restored, and the rate of peeling on all 16 samples of the surface-mounted LED's A was determined by observing the peeling conditions between the bottom wall of the PPA resin casing 1 and the aforementioned thermally cured bodies of the compositions under an optical microscope.

[Rate of Peeling after Maintaining the LED's for 30 sec. at 280° C.]

After maintaining all 16 surface-mounted type LED's in the aforementioned constant temperature and constant humid conditions, the LED's were held in an oven at 280° C. for 30 sec., were taken out from the oven, and were maintained at room temperature (25° C.), the rate of peeling on all 16 samples was determined by observing the peeling conditions between the bottom wall of the PPA resin casing 1 and the aforementioned thermally cured bodies of the thermally cured compositions under an optical microscope.

[Rate of Peeling after Temperature Impact Cycle]

All 16 surface-mounted type LED's A held at 250° C. for 30 sec. were subjected five times to a temperature cycle (−40° C. to +100° C.) consisting of 30 min. at −40° C., and 30 min. at +100° C., and then room temperature (25° C.) was restored, and the rate of peeling on all 16 samples of the surface-mounted LED's A was determined by observing the peeling conditions between the bottom wall of the PPA resin casings 1 and the aforementioned thermally cured bodies of the compositions under an optical microscope.

Reference Example 1

Preparation of (C) (8)

50 parts by weight of toluene were loaded into a reactor, and 19.3 parts by weight of n-butylacrylate, 11.5 parts by weight of glycidylmethacrylate, 2.0 parts by weight of γ-methacryloxypropyl trimethoxysilane, 5.0 parts by weight of γ-methacryloxypropyl tris(hydrodimethylsiloxy)silane, and 2.0 parts by weight of γ-mercaptopropyl trimethoxysilane were loaded dropwise into a dripping tank 1. A mixed solution of 10 parts by weight of toluene and 0.275 parts by weight of 2,2-azobisbutylonitrile was loaded into a dripping tank 2. The temperature in the reactor was raised to 80° C., and then the aforementioned liquid monomer mixture and the radical-polymerization initiator solution were added dropwise during 1 hour from the dripping tank 1 and the dripping tank 2, respectively. The temperature in the reactor was maintained for 6 hours at 100° C., then raised to 120° C., and the toluene was removed by distillation at a reduced pressure of 10 to 20 Torr. The residue was cooled, and, as a result, a radical copolymer of n-butylacrylate, glycidylmethacrylate, γ-methacryloxypropyl trimethoxysilane, and γ-methacryloxypropyl tris(hydrodimethylsiloxy)silane was obtained. The obtained product had the following characteristics: slightly yellowing transparent liquid; a viscosity of 180,000 mPa·s, a refractive index of 1.4723; a content of the silicon-bonded hydrogen atoms of 0.08 wt %; a content of the silicon-bonded methoxy groups of 4.8 wt. %; an epoxy equivalent of 470.

Reference Example 2

Preparation of (C) (13)

50 parts by weight of toluene were loaded into a reactor, and 6.6 parts by weight of n-butylacrylate, 17.0 parts by weight of glycidylmethacrylate, 3.0 parts by weight of γ-mercaptopropyl trimethoxysilane, and 4.6 parts by weight of γ-methacryloxypropyl tris(hydrodimethylsiloxy)silane were loaded into a dripping tank 1. A mixed solution of 10 parts by weight of toluene and 0.275 parts by weight of 2,2-azobisbutylonitrile was loaded into a dripping tank 2. The temperature in the reactor was raised to 80° C., and then the aforementioned liquid monomer mixture and the radical-polymerization initiator solution were added dropwise during 1 hour from the dripping tank 1 and the dripping tank 2, respectively. The temperature in the reactor was maintained for 6 hours at 100° C., then raised to 120° C., and the toluene was removed by distillation at a reduced pressure of 10 to 20 Torr. The residue was cooled, and, as a result, a radical copolymer of n-butylacrylate, glycidylmethacrylate, and γ-methacryloxypropyl tris(hydrodimethylsiloxy)silane was obtained. The obtained product had the following characteristics: slightly yellowing transparent liquid; a viscosity of 10,000 mPa·s; a refractive index of 1.612; a content of the silicon-bonded hydrogen atoms of 0.37 wt %; a content of the silicon-bonded methoxy groups of 1.7 wt. %; an epoxy equivalent of 690.

Reference Example 3

Preparation of (C) (14)

50 parts by weight of toluene were loaded into a reactor, and 6.56 parts by weight of n-butylacrylate, 12.8 parts by weight of γ-methacryloxypropyl trimethoxysilane, 1.2 parts by weight of γ-mercaptopropyl trimethoxysilane, and 20.0 parts by weight of γ-methacryloxypropyl tris(hydrodimethylsiloxy)silane were loaded into a dripping tank 1. A mixed solution of 10 parts by weight of toluene and 0.275 parts by weight of 2,2-azobisbutylonitrile was loaded into a dripping tank 2. The temperature in the reactor was raised to 80° C., and then the aforementioned liquid monomer mixture and the radical-polymerization initiator solution were added dropwise during 1 hour from the dripping tank 1 and the dripping tank 2, respectively. The temperature in the reactor was maintained for 6 hours at 100° C., then raised to 120° C., and the toluene was removed by distillation at a reduced pressure of 10 to 20 Torr. The residue was cooled, and, as a result, a radical copolymer of n-butylacrylate, γ-methacryloxypropyl trimethoxysilane, and γ-methacryloxypropyl tris (hydrodimethylsiloxy) silane was obtained. The obtained product had the following characteristics: slightly yellowing transparent liquid; a viscosity of 10,000 mPa·s; a refractive index of 1.4532; a content of the silicon-bonded hydrogen atoms of 0.42 wt %; a content of the silicon-bonded methoxy groups of 13.4 wt. %.

Reference Example 4

Preparation of (C) (15)

50 parts by weight of toluene were loaded into a reactor, and 9.5 parts by weight of n-butylacrylate, 10.5 parts by weight of glycidylmethacrylate, 18 parts by weight of γ-methacryloxypropyl trimethoxysilane, 1.8 parts by weight of γ-mercaptopropyl trimethoxysilane were loaded into a dripping tank 1. A mixed solution of 10 parts by weight of toluene and 0.275 parts by weight of 2,2-azobisbutylonitrile was loaded into a dripping tank 2.

The temperature in the reactor was raised to 80° C., and then the aforementioned liquid monomer mixture and the radical-polymerization initiator solution were added dropwise during 1 hour from the dripping tank 1 and the dripping tank 2, respectively. The temperature in the reactor was maintained for 6 hours at 100° C., then raised to 120° C., and the toluene was removed by distillation at a reduced pressure of 10 to 20 Torr. The residue was cooled, and, as a result, a radical copolymer of n-butylacrylate, glycidyl methacrylate, and γ-methacryloxypropyl trimethoxysilane was obtained. The obtained product had the following characteristics: slightly yellowing transparent liquid; a viscosity of 10,000 mPa·s; a refractive index of 1.4756; a content of the silicon-bonded hydrogen atoms of 0 wt %; a content of the silicon-bonded methoxy groups of 19.3 wt. %; an epoxy equivalent of 530.

Reference Example 5

Preparation of (C) (16)

50 parts by weight of toluene were loaded into a reactor, and 10 parts by weight of n-butylacrylate, 1.5 parts by weight of γ-mercaptopropyl trimethoxysilane, and 30 parts by weight of γ-methacryloxypropyl tris(hydrodimethylsiloxy)silane were loaded into a dripping tank 1. A mixed solution of 10 parts by weight of toluene and 0.275 parts by weight of 2,2-azobisbutylonitrile was loaded into a dripping tank 2.

The temperature in the reactor was raised to 80° C., and then the aforementioned liquid monomer mixture and the radical-polymerization initiator solution were added dropwise during 1 hour from the dripping tank 1 and the dripping tank 2, respectively. The temperature in the reactor was maintained for 6, hours at 100° C., then raised to 120° C., and the toluene was removed by distillation at a reduced pressure of 10 to 20 Torr. The residue was cooled, and, as a result, a radical copolymer of n-butylacrylate, and γ-methacryloxypropyl tris(hydrodimethylsiloxy)silane was obtained. The obtained product had the following characteristics: slightly yellowing transparent liquid; a viscosity of 30,000 mPa·s; a refractive index of 1.4468; a content of the silicon-bonded hydrogen atoms of 0.50 wt %; a content of the silicon-bonded methoxy groups of 1.5 wt. %.

Comparative Reference Example 1

50 parts by weight of toluene were loaded into a reactor, and 20 parts by weight of n-butylacrylate, 12.7 parts by weight of glycidyl methacrylate, 2.0 parts by weight of γ-methacryloxypropyl trimethoxysilane, and 5.3 parts by weight of γ-methacryloxypropyl tris(hydrodimethylsiloxy)

silane were loaded into a dripping tank 1. A mixed solution of 10 parts by weight of toluene and 0.275 parts by weight of 2,2-azobisbutylonitrile was loaded into a dripping tank 2.

The temperature in the reactor was raised to 80° C., and then the aforementioned liquid monomer mixture and the radical-polymerization initiator solution were added dropwise during 1 hour from the dripping tank 1 and the dripping tank 2, respectively. The temperature in the reactor was maintained for 6 hours at 100° C., then raised to 120° C., and the toluene was removed by distillation at a reduced pressure of 10 to 20 Torr. The residue was cooled, and, as a result, a radical copolymer of n-butylacrylate, glycidyl methacrylate, γ-methacryloxypropyl trimethoxysilane, and γ-methacryloxypropyl tris(hydrodimethylsiloxy)silane, was obtained. The obtained copolymer was solid at room temperature, was not compatible with the organopolysiloxanes used in the practical examples, and was unsuitable for compounding with the curable organopolysiloxane composition of the present invention.

Practical Examples 1 to 3, Comparative Examples 1 to 7

In Practical Examples 1 to 3 and Comparative Examples 1 to 7, curable organopolysiloxanes were prepared from various below-given components added in various quantities indicated in Tables 1 and 2 in parts by weight, except for (D) (11); the amounts of which added to the composition are indicated in weight units of platinum metal (ppm units).

In the below-given formula, Ph designates a phenyl group, Vi designates a vinyl group, and Me designates a methyl group.

- (A) (1): methylphenylpolysiloxane having both molecular terminals capped with vinyldimethylsiloxy groups (average number of silicon atoms: 30; viscosity: 1000 mPa·s; average unit formula: $R_{2.06}SiO_{0.98}$)
- (A) (2): methylphenylpolysiloxane having both molecular terminals capped with vinyldimethylsiloxy groups (average number of silicon atoms: 120; viscosity: 15,000 mPa·s; average unit formula: $R_{2.02}SiO_{0.99}$)
- (A) (3): average siloxane unit formula: $(PhSiO_{3/2})_{0.75}(ViMe_2SiO_{1/2})_{0.25}$ (weight-average molecular weight: 2400; toluene soluble white solid substance; average unit formula: $R_{1.5}SiO_{1.25}$)
- (A) (4): average siloxane unit formula: $(PhSiO_{3/2})_{0.75}(ViMe_2SiO_{1/2})_{0.10}(Me_2SiO_{2/2})_{0.15}$ (weight-average molecular weight: 7,700; viscosity: 100,000 Pa·s; average unit formula: $R_{1.25}SiO_{1.38}$)
- (B) (5): molecular formula [H-Me$_2$SiO—]$_3$Si-Ph (viscosity: 1.7 mPa·s; average unit formula: $R^1_{1.75}H_{0.75}SiO_{0.75}$)
- (B) (6): molecular formula H-Me$_2$SiO-Ph$_2$SiO—SiMe$_2$H (viscosity: 1.7 mPa·s; average unit formula: $R^1_{2.0}H_{0.67}SiO_{0.67}$)
- (B) (7): average composition formula $(PhSiO_{3/2})_{0.60}(HMe_2SiO_{1/2})_{0.40}$ (weight-average molecular weight: 1,000; viscosity: 750 mPa·s; average unit formula: $R^1_{1.40}H_{0.40}SiO_{1.10}$)
- (C) (8): the same as in Reference Example 1.
- (C) (9): average molecular formula $$\{(CH_2{=}CH)CH_3SiO_{2/2}\}_a(CH_3O_{1/2})_b\{(CH_2{-}CHCH_2O(CH_2)_3SiO_{3/2}\}_c(CH_3)_2SiO_{2/2}\}_d$$

where, a=3, b=5, c=5, d=20.

- (C) (10): average molecular formula $$\{(CH_2{=}CH)CH_3SiO_{2/2}\}_a(CH_3O_{1/2})_b\{(CH_2{=}CH)(CH_2)_3SiO_{3/2}\}_c\{(CH_3)_2SiO_{2/2}\}_d,$$

where, a=3, b=5, c=5, d=20.

- (D) (11): complex of platinum and 1,3-divinyltetramethyldisiloxane.
- (E) (12): 3-phenyl-1-butin-3-ol

TABLE 1

|  | Pr. Ex. 1 | Pr. Ex. 2 | Pr. Ex. 3 | Comp. Ex. 1 | Comp. Ex. 2 |
|---|---|---|---|---|---|
| (A) (1) | 11.15 | 11.15 | 30.00 | 11.15 | 11.15 |
| (A) (2) | 41.25 | 41.25 | 15.00 | 41.25 | 41.25 |
| (A) (3) | 33.75 | 30.75 | 30.00 | 33.75 | 33.75 |
| (A) (4) |  | 3.00 |  |  |  |
| (B) (5) | 1.00 | 1.00 | 1.00 | 1.00 | 1.00 |
| (B) (6) | 11.75 | 11.75 | 12.00 | 11.75 | 11.75 |
| (B) (7) |  |  | 5.00 |  |  |
| (C) (8) | 1.00 | 1.00 | 1.00 |  |  |
| (C) (9) |  |  |  | 1.00 |  |
| (C) (10) |  |  |  |  | 1.00 |
| (D) (11) | 4 | 4 | 4 | 4 | 4 |
| (E) (12) | 0.01 | 0.01 | 0.01 | 0.10 | 0.01 |

TABLE 2

|  | Comp/ Ex. 3 | Comp/ Ex. 4 | Comp/ Ex. 5 | Comp/ Ex. 6 | Comp/ Ex. 7 |
|---|---|---|---|---|---|
| (A) (1) | 11.15 | 11.15 | 15 | 0.25 | 8.75 |
| (A) (2) | 41.25 | 41.25 | 59.72 | 77.4 | 50.10 |
| (A) (3) | 30.75 | 30.75 | 1.98 |  | 12.60 |
| (A) (4) | 3.00 | 3.00 |  | 2.1 |  |
| (B) (5) | 1.00 | 1.00 |  | 1.00 |  |
| (B) (6) | 11.75 | 11.75 |  |  |  |
| (B) (7) |  |  | 18.00 | 14.25 | 23.00 |
| (C) (8) |  |  |  |  |  |
| (C) (9) | 1.00 |  | 5.00 | 5.00 | 5.00 |
| (C) (10) |  | 1.00 |  |  |  |
| (D) (11) | 4 | 4 | 2 | 2 | 2 |
| (E) (12) | 0.01 | 0.01 | 0.03 |  | 0.01 |

Since the aforementioned curable organopolysiloxane compositions are composed of three types of components (A) and two types of components (B), Tables 3 and 4 show average values "a" and average mole % of phenyl groups of all components (A), as well as average values "b" and "c" and average mole % of all components (B).

TABLE 3

|  | Pr. Rx. 1 | Pr. Ex. 2 | Pr. Ex. 3 | Comp. Ex. 1 | Com. Ex. 2 |
|---|---|---|---|---|---|
| "a" of component (A) | 1.82 | 1.81 | 1.83 | 1.82 | 1.82 |
| Phenyl groups of component (A) (mole %) | 48.8 | 49.1 | 47.9 | 48.8 | 48.8 |
| "b" of component (B) | 1.98 | 1.98 | 1.82 | 1.98 | 1.98 |
| "c" of component (B) | 0.68 | 0.68 | 0.60 | 0.68 | 0.68 |
| Phenyl groups of component (B) (mole %) | 31.8 | 31.8 | 34.9 | 31.8 | 31.8 |

TABLE 4

|  | Comp. Ex. 3 | Comp. Ex. 4 | Comp. Ex. 5 | Comp. Ex. 6 | Comp. Ex. 7 |
|---|---|---|---|---|---|
| "a" of component (A) | 1.81 | 1.81 | 2.01 | 2.00 | 1.93 |
| Phenyl groups of component (A) (mole %) | 49.1 | 49.1 | 48.1 | 49.0 | 48.5 |
| "b" of component (B) | 1.98 | 1.98 | 1.40 | 1.42 | 1.07 |
| "c" of component (B) | 0.68 | 0.68 | 0.40 | 0.42 | 0.31 |
| Phenyl groups of component (B) (mole %) | 31.8 | 31.8 | 42.9 | 40.0 | 32.9 |

Tables 5 and 6 show curing conditions of the curable organopolysiloxane compositions, their viscosities, characteristics of cured bodies, as well as rates of peeling of cured bodies used in surface-mounted type LED's A

TABLE 5

| | | Pr. Ex. 1 | Pr. Ex. 2 | Pr. Ex. 3 | Comp. Ex. 1 | Comp. Ex. 2 |
|---|---|---|---|---|---|---|
| Composition | Viscosity (mPa·s) | 10000 | 11000 | 7000 | 6500 | 7000 |
| | Refractive Index | 1.53 | 1.53 | 1.53 | 1.53 | 1.53 |
| Cured body | Light transmittance (%) | 98 | 98 | 98 | 99 | 97 |
| | Hardness | 25 | 25 | 20 | 40 | 35 |
| | Tensile strength (kgf/cm$^2$) | 4.5 | 3.5 | 4.5 | 8 | 4.5 |
| | Elongation (%) | 70 | 70 | 65 | 30 | 40 |
| | Tear strength (kgf/cm) | 3.5 | 2.5 | 2.5 | 1.8 | 1.8 |
| Curing conditions | 1$^{st}$ curing stage temperature (° C.) | 60 | 60 | 60 | 110 | 80 |
| | 2$^{nd}$ curing stage temperature (° C.) | 150 | 150 | 150 | 150 | 150 |
| Rate of peeling | after initial curing | 0/16 | 0/16 | 0/16 | 3/16 | 2/16 |
| | after maintaining at constant temperature & humidity conditions | 0/16 | 0/16 | 0/16 | 4/16 | 8/16 |
| | after maintaining for 30 sec. at 280° C. | 0/16 | 0/16 | 0/16 | 12/16 | 13/16 |
| | after heat impact cycle | 0/16 | 0/16 | 1/16 | 14/16 | 14/16 |

TABLE 6

| | | Comp. Ex. 3 | Comp. Ex. 4 | Comp. Ex. 5 | Comp. Ex. 6 | Comp. Ex. 7 |
|---|---|---|---|---|---|---|
| Composition | Viscosity (mPa·s) | 6500 | 7000 | 5500 | 3000 | 5000 |
| | Refractive Index | 1.53 | 1.53 | 1.53 | 1.53 | 1.53 |
| Cured body | Light transmittance (%) | 99 | 97 | 99 | 98 | 98 |
| | Hardness | 40 | 35 | 35 | 15 | 55 |
| | Tensile strength (kgf/cm$^2$) | 8 | 4.5 | 2.5 | 4.5 | 8.5 |
| | Elongation (%) | 30 | 40 | 45 | 90 | 25 |
| | Tear strength (kgf/cm) | 1.8 | 1.8 | 1.2 | 1.5 | 2.5 |
| Curing conditions | 1st curing stage temperature (° C.) | 110 | 80 | 120 | 120 | 120 |
| | 2$^{nd}$ curing stage temperature (° C.) | 150 | 150 | 150 | 150 | 150 |
| Rate of peeling | after initial curing | 2/16 | 3/16 | 0/16 | 0/16 | 10/16 |
| | after maintaining at constant temperature & humidity conditions | 5/16 | 3/16 | 0/16 | 0/16 | 10/16 |
| | after maintaining for 30 sec. at 280° C. | 12/16 | 4/16 | 10/16 | 3/16 | 15/16 |
| | after heat impact cycle | 16/16 | 16/16 | 14/16 | 9/16 | 15/16 |

Practical Examples 4 to 6, Comparative Examples 8 to 10

Curable organopolysiloxanes of Practical Examples 4 to 6 and Comparative Examples 8 to 10 were prepared by mixing components designated as (A) to (E), as described above for Practical Examples 1 to 3 and Comparative Examples 1 to 7, with adhesion promoters described in the Reference Examples in proportions (parts by weight) shown in Table 7, except for (D)(11), the amounts of which added to the composition are indicated in weight units of platinum metal (ppm units).

TABLE 7

|         | Pr. Ex. 4 | Pr. Ex. 5 | Pr. Ex. 6 | Comp. Ex. 8 | Comp. Ex. 9 | Comp. Ex. 10 |
|---------|-----------|-----------|-----------|-------------|-------------|--------------|
| (A) (1) | 25.00     | 25.00     | 25.00     | 25.00       | 25.00       | 25.00        |
| (A) (2) | 15.00     | 15.00     | 15.00     | 15.00       | 15.00       | 15.00        |
| (A) (3) | 30.00     | 30.00     | 30.00     | 30.00       | 30.00       | 30.00        |
| (B) (5) | 1.00      | 1.00      | 1.00      | 1.00        | 1.00        | 1.00         |
| (B) (6) | 12.00     | 12.00     | 12.00     | 12.00       | 12.00       | 12.00        |
| (C) (8) | 1.00      |           |           |             |             |              |
| (C) (13)|           | 1.00      |           |             |             |              |
| (C) (14)|           |           | 1.00      |             |             |              |
| (C) (15)|           |           |           | 1.00        |             |              |
| (C) (16)|           |           |           |             | 1.00        |              |
| (C) (9) |           |           |           |             |             | 1.00         |
| (D) (11)| 2         | 2         | 2         | 2           | 2           | 2            |
| (E) (12)| 0.01      | 0.01      | 0.01      | 0.01        | 0.01        | 0.01         |

Since the curable organopolysiloxane compositions of Practical Examples 4 to 6 and Comparative Examples 8 to 10 were prepared with the use of components (A) of three types and components (B) of two type, the average values were determined for all components (A) as a=2.03 and 48 mole % on average for phenyl groups, and for all components (B) as b=2.00, c=0.43, and 32 mole % on average for phenyl groups.

Regarding the curable organopolysiloxane compositions of Practical Examples 4 to 6 and Comparative Examples 8 to 10, Table 8 shows amounts of monomers used in the preparation of adhesion promoters, amounts of functional groups in the adhesion promoters, viscosities of the aforementioned curable organopolysiloxane compositions, properties of cured bodies obtained from these compositions, and rates of peeling of the cured bodies used in the surface-mounted type LED's A.

TABLE 8

|  |  | Pr. Ex. 4 | Pr. Ex. 5 | Pr. Ex. 6 | Comp. Ex. 8 | Comp. Ex. 9 | Comp. Ex. 10 |
|---|---|---|---|---|---|---|---|
| Adhesion promoter | | (C) (8) | (C) (13) | (C) (14) | (C) (15) | (C) (16) | (C) (9) |
| $CH_2CHCOO(n-C_4H_9)$ | | 19.3 | 6.6 | 6.5 | 9.5 | 10 | |
| $CH_2{=}C(Me)COOCH_2$ (Epoxy) | | 11.5 | 17 | | 10.5 | | |
| $CH_2{=}C(Me)COO(CH_2)_3Si(OMe)$ | | 2.0 | | 12.8 | 18 | | |
| $HS(CH_2)_3Si(OMe)_3$ | | 2.0 | 3.0 | 1.2 | 1.8 | 1.5 | |
| $CH_2{=}C(Me)COO(CH_2)_3Si(OSiMe_2H)_3$ | | 5.0 | 4.6 | 20 | | 30 | |
| Epoxy equivalent | | 470 | 690 | 0 | 530 | 0 | 540 |
| (Si bonded) OMe (wt. %) | | 4.8 | 1.7 | 13.4 | 19.3 | 1.5 | 5.8 |
| (Si bonded) H (wt. %) | | 0.08 | 0.37 | 0.42 | 0 | 0.50 | 0 |
| Composition | Viscosity (mPa·s) | 6000 | 5000 | 5000 | 5500 | 5000 | 4500 |
|  | Refractive index | 1.53 | 1.53 | 1.53 | 1.53 | 1.53 | 1.53 |
| Cured body | Light transmittance (%) | 98 | 90 | 90 | 95 | 80 | 98 |
|  | Hardness | 25 | 28 | 25 | 30 | 28 | 40 |
|  | Tensile strength (kgf/cm$^2$) | 4.5 | 3.5 | 4.5 | 3.0 | 4.0 | 3.5 |
|  | Elongation (%) | 70 | 70 | 65 | 60 | 70 | 40 |
|  | Tear strength (kgf/cm) | 3.5 | 3.0 | 3.5 | 3.0 | 3.0 | 2.0 |
|  | Adhesion to PPA (MPa) | 0.37 | 0.58 | 0.45 | 0.22 | 0.35 | 0.25 |
|  | Adhesion to aluminum (MPa) | 0.43 | 0.67 | 0.53 | 0.25 | 0.41 | 0.21 |
| Curing conditions | 1$^{st}$ curing stage temperature (°C.) | 60 | 60 | 60 | 60 | 60 | 110 |
|  | 2$^{nd}$ curing stage temperature (°C.) | 150 | 150 | 150 | 150 | 150 | 150 |
| Rate of peeling | After initial curing | 0/16 | 0/16 | 0/16 | 3/16 | 2/16 | 4/16 |
|  | After constant temperature & humidity conditions | 0/16 | 0/16 | 0/16 | 4/16 | 8/16 | 5/16 |
|  | After 280° C./30 sec. | 0/16 | 0/16 | 0/16 | 12/16 | 13/16 | 12/16 |
|  | After thermal impact cycle | 0/16 | 0/16 | 1/16 | 14/16 | 13/16 | 16/16 |

Practical Examples 7 to 9, Comparative Examples 11 to 17

Curable organopolysiloxanes of Practical Examples 7 to 9 and Comparative Examples 11 to 17 were prepared by mixing components designated as (A) to (E), as described above for Practical Examples 1 to 3 and Comparative Examples 1 to 7, in proportions shown in Tables 9 and 10 in parts by weight, except for (D)(11), the amounts of which added to the composition are indicated in weight units of platinum metal (ppm units).

TABLE 9

|  | Pr. Ex. 7 | Pr. Ex. 8 | Pr. Ex. 9 | Comp. Ex. 11 | Comp. Ex. 12 |
| --- | --- | --- | --- | --- | --- |
| (A) (1) |  |  |  |  |  |
| (A) (2) | 52.00 | 50.00 | 55.00 | 52.00 | 50.00 |
| (A) (3) | 30.00 | 20.00 | 10.00 | 30.00 | 20.00 |
| (A) (4) |  | 10.00 | 20/00 |  | 10.00 |
| (B) (5) | 1.00 | 1.00 | 1.00 | 1.00 | 1.00 |
| (B) (6) | 4.00 | 3.00 | 1.00 | 4.00 | 3.00 |
| (B) (7) | 10.00 | 10.00 | 7.00 | 10.00 | 10.00 |
| (C) (8) | 1.00 | 1.00 | 1.00 |  |  |
| (C) (9) |  |  |  | 1.00 | 1.00 |
| (C) (10) |  |  |  |  |  |
| (D) (11) | 4 | 4 | 4 | 4 | 4 |
| (E) (12) | 0.01 | 0.01 | 0.01 | 0.01 | 0.10 |

TABLE 10

|  | Comp. Ex. 13 | Comp. Ex. 14 | Comp. Ex. 15 | Comp. Ex. 16 | Comp. Ex. 17 |
| --- | --- | --- | --- | --- | --- |
| (A) (1) |  |  |  |  | 8.75 |
| (A) (2) | 55.00 | 52.00 | 50.00 | 55.00 | 50.10 |
| (A) (3) | 10.00 | 30.00 | 20.00 | 10.00 | 12.60 |
| (A) (4) | 20.00 |  | 10.00 | 20.0 | 23.00 |
| (B) (5) | 1.00 | 1.00 | 1.00 | 1.00 |  |
| (B) (6) | 1.00 | 4.00 | 3.00 | 1.00 |  |
| (B) (7) | 7.00 | 10.00 | 10.00 | 7.00 | 23.00 |
| (C) (8) |  |  |  |  |  |
| (C) (9) | 1.00 |  |  |  | 5.00 |
| (C) (10) |  | 1.00 | 1.00 | 1.00 |  |
| (D) (11) | 4 | 4 | 4 | 4 | 2 |
| (E) (12) | 0.01 | 0.01 | 0.01 | 0.01 | 0.01 |

Since the aforementioned curable organopolysiloxane compositions were prepared with the use of components (A) of two or three types and components (B) of two type, Tables 11 and 12 show average values "a" and average contents of phenyl groups (mole %) of all components (A) and average values "b" and "c" and average contents of phenyl groups (mole %) of all components (B).

TABLE 11

|  | Comp. Ex. 7 | Comp. Ex. 8 | Comp. Ex. 9 | Comp. Ex. 11 | Comp. Ex. 12 |
| --- | --- | --- | --- | --- | --- |
| "a" of component (A) | 1.83 | 1.79 | 1.78 | 1.83 | 1.79 |
| Phenyl groups of component (A) (mole %) | 49.2 | 50.4 | 51.5 | 49.2 | 50.4 |
| "b" of component (B) | 1.58 | 1.55 | 1.51 | 1.58 | 1.55 |
| "c" of component (B) | 0.50 | 0.48 | 0.47 | 0.50 | 0.48 |
| Phenyl groups of component (B) (mole %) | 38.4 | 38.8 | 38.7 | 38.4 | 38.8 |

TABLE 12

|  | Comp. Ex. 13 | Comp. Ex. 14 | Comp. Ex. 15 | Comp. Ex. 16 | Comp. Ex. 17 |
| --- | --- | --- | --- | --- | --- |
| "a" of component (A) | 1.78 | 1.83 | 1.79 | 1.78 | 1.93 |
| Phenyl groups of component (A) (mole %) | 51.5 | 49.2 | 50.4 | 51.5 | 48.5 |
| "b" of component (B) | 1.51 | 1.58 | 1.55 | 1.51 | 1.40 |
| "c" of component (B) | 0.47 | 0.50 | 0.48 | 0.47 | 0.40 |
| Phenyl groups of component (B) (mole %) | 38.7 | 38.4 | 38.8 | 38.7 | 42.9 |

Tables 13 and 14 show curing conditions of the aforementioned curable organopolysiloxane compositions, their viscosities, characteristics of cured bodies, as well as rates of peeling of cured bodies used in surface-mounted type LED's A.

TABLE 13

|  |  | Pr. Ex. 7 | Pr. Ex. 8 | Pr. Ex. 9 | Comp. Ex. 11 | Comp. Ex. 12 |
| --- | --- | --- | --- | --- | --- | --- |
| Composition | Viscosity (mPa·s) | 12000 | 10000 | 10500 | 9500 | 9000 |
|  | Refractive index | 1.53 | 1.53 | 1.53 | 1.53 | 1.53 |
| Cured body | Light transmittance (%) | 98 | 98 | 98 | 99 | 99 |
|  | Hardness | 30 | 28 | 25 | 45 | 40 |
|  | Tensile strength (kgf/cm$^2$) | 4.5 | 3.5 | 4.5 | 40 | 4.0 |
|  | Elongation (%) | 65 | 65 | 65 | 30 | 35 |
|  | Tear strength (kgf/cm) | 3.5 | 3.0 | 3.0 | 2.5 | 3.0 |
| Curing conditions | 1$^{st}$ curing stage temperature (°C.) | 60 | 60 | 110 | 110 | 110 |
|  | 2$^{nd}$ curing stage temperature (°C.) | 150 | 150 | 150 | 150 | 150 |

TABLE 13-continued

|  |  | Pr. Ex. 7 | Pr. Ex. 8 | Pr. Ex. 9 | Comp. Ex. 11 | Comp. Ex. 12 |
|---|---|---|---|---|---|---|
| Rate of peeling | After initial curing | 0/16 | 0/16 | 0/16 | 0/16 | 3/16 |
|  | After constant temperature & humidity conditions | 0/16 | 0/16 | 0/16 | 0/16 | 4/16 |
|  | After 280° C./30 sec. | 0/16 | 0/16 | 2/16 | 2/16 | 12/16 |
|  | After thermal impact cycle | 0/16 | 0/16 | 3/16 | 3/16 | 14/16 |

TABLE 14

|  |  | Comp. Ex. 13 | Comp. Ex. 14 | Comp. Ex. 15 | Comp. Ex. 16 | Comp. Ex. 17 |
|---|---|---|---|---|---|---|
| Composition | Viscosity (mPa·s) | 9000 | 9500 | 9000 | 9000 | 5000 |
|  | Refractive index | 1.53 | 1.53 | 1.53 | 1.53 | 1.53 |
| Cured body | Light transmittance (%) | 99 | 99 | 99 | 99 | 98 |
|  | Hardness | 35 | 30 | 25 | 25 | 55 |
|  | Tensile strength (kgf/cm$^2$) | 4.5 | 8 | 4.5 | 2.5 | 8.5 |
|  | Elongation (%) | 45 | 30 | 40 | 45 | 25 |
|  | Tear strength (kgf/cm) | 3.5 | 2.0 | 2.5 | 2.5 | 3.0 |
| Curing conditions | 1$^{st}$ curing stage temperature (°C.) | 110 | 60 | 60 | 60 | 110 |
|  | 2$^{nd}$ curing stage temperature (°C.) | 150 | 150 | 150 | 150 | 150 |
| Rate of peeling | After initial curing | 2/16 | 2/16 | 3/16 | 0/16 | 0/16 |
|  | After constant temperature & humidity conditions | 8/16 | 5/16 | 0/16 | 0/16 | 0/16 |
|  | After 280° C./30 sec. | 13/16 | 12/16 | 4/16 | 10/16 | 3/16 |
|  | After thermal impact cycle | 14/16 | 16/16 | 16/16 | 14/16 | 9/16 |

Practical Examples 10 to 12, Comparative Examples 18 to 20

Curable organopolysiloxanes of Practical Examples 10 to 12 and Comparative Examples 18 to 20 were prepared by mixing components designated as (A) to (E), as described above for Practical Examples 1 to 3 and Comparative Examples 1 to 7, and the adhesion promoters used in the Reference Examples in proportions shown in Table 15 in parts by weight, except for (D)(11), the amounts of which added to the composition are indicated in weight units of platinum metal (ppm units).

TABLE 15

|  | Pr. Ex. 10 | Pr. Ex. 11 | Pr. Ex. 12 | Comp. Ex. 18 | Comp. Ex. 19 | Comp. Ex. 20 |
|---|---|---|---|---|---|---|
| (A) (1) | 8.30 | 8.30 | 8.30 | 8.30 | 8.30 | 8.30 |
| (A) (2) | 72.00 | 72.00 | 72.00 | 72.00 | 72.00 | 72.00 |
| (A) (3) | 6.50 | 6.50 | 6.50 | 6.50 | 6.50 | 6.50 |
| (B) (7) | 12.00 | 12.00 | 12.00 | 12.00 | 12.00 | 12.00 |
| (C) (8) | 1.00 |  |  |  |  |  |
| (C) (13) |  | 1.00 |  |  |  |  |
| (C) (14) |  |  | 1.00 |  |  |  |
| (C) (15) |  |  |  | 1.00 |  |  |
| (C) (16) |  |  |  |  | 1.00 |  |
| (C) (9) |  |  |  |  |  | 1.00 |
| (D) (11) | 2 | 2 | 2 | 2 | 2 | 2 |
| (E) (12) | 0.01 | 0.01 | 0.01 | 0.01 | 0.01 | 0.01 |

Since the curable organopolysiloxane compositions of Practical examples 10 to 12 and Comparative examples 18 to 20 were prepared with the use of components (A) of three types, the average values were determined for all components (A) as a=2.02 and 48 mole % on average for phenyl groups, and for all components (B) as b=1.40, c=0.40 and 43 mole % on average for phenyl groups.

Regarding the curable organopolysiloxane compositions of Practical Examples 10 to 12 and Comparative Examples 18 to 20, Table 16 shows amounts of monomers used in the preparation of adhesion promoters, amounts of functional groups in the adhesion promoters, viscosities of the aforementioned curable organopolysiloxane compositions, properties of cured bodies obtained from these compositions, and rates of peeling of the cured bodies used in the surface-mounted type LED's.

or other organic resins, metals, inorganic semiconductors, ceramics, glass, etc. with which the composition is in contact during curing.

The semiconductor device of the present invention is useful for a light-emitting device, LED display, etc. The adhesion promoter of the present invention is useful as an adhesion promoter of curable organopolysiloxane compositions, organic resin compositions, rubber compositions, etc.

TABLE 16

|  |  | Pr. Ex. 10 | Pr. Ex. 11 | Pr. Ex. 12 | Comp. Ex. 18 | Comp. Ex. 19 | Comp. Ex. 20 |
|---|---|---|---|---|---|---|---|
| Adhesion promoter |  | (C) (8) | (C) (13) | (C) (14) | (C) (15) | (C) (16) | (C) (9) |
| $CH_2CHCOO(n-C_4H_9)$ |  | 19.3 | 6.6 | 6.5 | 9.5 | 10 |  |
| $CH_2=C(Me)COOCH_2$ (Epoxy) |  | 11.5 | 17 |  | 10.5 |  |  |
| $CH_2=C(Me)COO(CH_2)_3Si(OMe)$ |  | 2.0 |  | 12.8 | 18 |  |  |
| $HS(CH_2)_3Si(OMe)_3$ |  | 2.0 | 3.0 | 1.2 | 1.8 | 1.5 |  |
| $CH_2=C(Me)COO(CH_2)_3Si(OSiMe_2H)_3$ |  | 5.0 | 4.6 | 20 |  | 30 |  |
| Epoxy equivalent |  | 470 | 690 | 0 | 530 | 0 | 540 |
| (Si bonded) OMe (wt. %) |  | 4.8 | 1.7 | 13.4 | 19.3 | 1.5 | 5.8 |
| (Si bonded) H (wt. %) |  | 0.08 | 0.37 | 0.42 | 0 | 0.50 | 0 |
| Composition | Viscosity (mPa·s) | 9500 | 7000 | 7000 | 7000 | 7500 | 6500 |
|  | Refractive index | 1.53 | 1.53 | 1.53 | 1.53 | 1.53 | 1.53 |
| Cured body | Light transmittance (%) | 95 | 90 | 92 | 85 | 70 | 90 |
|  | Hardness | 38 | 32 | 35 | 35 | 32 | 50 |
|  | Tensile strength (kgf/cm2) | 4.5 | 3.5 | 4.5 | 3.0 | 4.0 | 3.5 |
|  | Elongation (%) | 70 | 70 | 65 | 60 | 70 | 40 |
|  | Tear strength (kgf/cm) | 3.5 | 3.0 | 3.5 | 3.0 | 3.0 | 2.0 |
|  | Adhesion to PPA (MPa) | 0.37 | 0.58 | 0.45 | 0.22 | 0.35 | 0.25 |
|  | Adhesion to aluminum (MPa) | 0.41 | 0.64 | 0.50 | 0.24 | 0.39 | 0.24 |
| Curing conditions | $1^{st}$ curing stage temperature (° C.) | 60 | 60 | 60 | 60 | 60 | 110 |
|  | $2^{nd}$ curing stage temperature (° C.) | 150 | 150 | 150 | 150 | 150 | 150 |
| Rate of peeling | After initial curing | 0/16 | 0/16 | 0/16 | 3/16 | 2/16 | 4/16 |
|  | After constant temperature & | 0/16 | 0/16 | 0/16 | 4/16 | 8/16 | 5/16 |
|  | After 280° C./30 sec. | 1/16 | 0/16 | 0/16 | 12/16 | 13/16 | 12/16 |
|  | After thermal impact cycle | 1/16 | 0/16 | 1/16 | 14/16 | 13/16 | 16/16 |

INDUSTRIAL APPLICABILITY

The curable organopolysiloxane composition of the present invention is suitable for use in conjunction with electrical devices, electronic parts, electronic instruments, electrical parts, etc., as an adhesive agent, potting agent, protective coating agent, underfill agent, etc., and especially, in view of its high refractive index and high light transmitting properties, as a sealing agent, adhesive agent, potting agent, protective coating agent, underfill agent, etc., for optical semiconductor elements and parts.

A method of the present invention for curing the aforementioned curable organopolysiloxane composition is useful for imparting to the composition, when cured, excellent initial adhesion and durable adhesion to various substrates, such as thermoplastic resins with polar bonds, thermosetting resins,

The invention claimed is:

1. A curable organopolysiloxane composition comprising: 100 parts by weight of (A) a mixture of (A1) a liquid organopolysiloxane of an average unit formula: $R_aSiO_{(4-a)/2}$ that contains in one molecule at least two unsaturated aliphatic groups and has a viscosity at 25° C. within the range of 10 to 100,000 mPa·s, wherein R designates an unsubstituted or halogen-substituted univalent hydrocarbon group with 1 to 10 carbon atoms, "a" is a positive number that satisfies the following condition: $1.9 \leq a \leq 2.2$, and no less than 20 mole % of all R's in one molecule are phenyl groups, and (A2) an organopolysiloxane resin of an average unit formula: $R_aSiO_{(4-a)/2}$ wherein R is an unsubstituted or halogen-substituted univalent hydrocarbon group with 1 to 10 carbon atoms, "a" is a positive number that satisfies the following condition: $0.5 \leq a \leq 1.7$, and no less than 20 mole % of all R's in one molecule are phenyl groups, wherein said mixture constituent (A1) is added in the amount of 99 to 30 wt. %, and said mixture constituent (A2) is added in the amount of 1 to 70 wt. %; (B) an organohydrogenpolysiloxane of an average unit formula: $R^1{}_b H_c SiO_{(4-b-c)/2}$ that contains in one molecule at least two silicon-bonded hydrogen atoms, wherein $R^1$ designates an unsubstituted or halogen-substituted univalent hydrocarbon group with 1 to 10 carbon atoms, "b" and "c" are positive numbers that satisfy the following conditions: $0.002<c<1$; $1.0<b<2.2$; and $1.0<(b+c)<3.0$ wherein said component (B) is added in such an amount that the mole ratio of said silicon-bonded hydrogen atoms of said component (B) to said unsaturated aliphatic groups of said component (A) is within the range of 0.3 to 5; 0.1 to 50 parts by weight of (C) a radical copolymer copolymerized from (a) a vinyl monomer that does not contain in its molecule an epoxy group, an alkoxysilyl group, and a hydrosilyl group, (b) a vinyl monomer having in its molecule an epoxy group and/or an alkoxysilyl group but not having a hydrosilyl group, and (c) a vinyl monomer having in one molecule a hydrosilyl group, said radical copolymer being copolymerized in the presence of (d) a chain-transfer agent; and a catalytic quantity of (D) a hydrosilation catalyst.

2. The curable organopolysiloxane composition of claim 1, wherein in said component (B) more than 20 mole % of $R^1$ are phenyl groups.

3. The curable organopolysiloxane composition of claim 1, wherein:
component (C) is a radical copolymer copolymerized from (a) a vinyl monomer that does not contain in its molecule an epoxy group, an alkoxysilyl group, and a hydrosilyl group, (b) a vinyl monomer having in its molecule an epoxy group and/or an alkoxysilyl group but not having a hydrosilyl group, and (c) a vinyl monomer having in one molecule a hydrosilyl group and represented by the following formula: $XSi[OSiH(R^3)_2]_g[OSi(R^3)_3]_h(R^4)_i$ wherein X is a radical-polymerizable vinyl-bond-containing group, $R^3$ is an aryl group or alkyl group with 1 to 10 carbon atoms, $R^4$ is an alkoxy group, an aryl group, or an alkyl group with 1 to 10 carbon atoms, "g" is an integer within the range of 1 to 3, "h" and "i" are integers within the range of 2 to 0, and $g+h+i=3$, said radical copolymer being copolymerized in the presence of (d) a chain-transfer agent comprising a mercapto-containing organic silicon compound or an organic mercaptan.

4. The curable organopolysiloxane composition of claim 3, wherein (a) is an acrylic acid alkyl ester or a methacrylic acid alkyl ester, (b) is an epoxy-substituted alkyl ester of a methacrylic acid, and/or an alkoxysilyl alkyl ester of a methacrylic acid, (c) is a compound wherein one hydrogen atom in an alkyl group of a methacrylic acid alkyl ester is substituted with the group of the following formula: $-Si[OSiH(R^3)_2]_g[OSi(R^3)_3]_h(R^4)_i$ where $R^3$, $R^4$, "g", "h", and "i" are the same as defined above, and said chain-transfer agent (d) comprises said mercapto-containing organic silicon compound wherein said mercapto-containing organic silicon compound is a mercaptoalkylalkoxysilane.

5. The curable organopolysiloxane composition of claim 4, wherein said acrylic acid alkyl ester is an acrylic acid n-butyl ester and said methacrylic acid alkyl ester is a methacrylic acid n-butyl ester, said epoxy-substituted alkyl ester of a methacrylic acid is a glycidylmethacrylate, said alkoxysilyl alkyl ester of a methacrylic acid is a γ-methacryloxypropyl trialkoxysilane, said compound wherein one hydrogen atom in the alkyl group of the methacrylic acid alkyl ester is substituted with a group of the following formula: $-Si[OSiH(R^3)_2]_g[OSi(R^3)_3]_h(R^4)_i$ where $R^3$, $R^4$, "g", "h", and "i" are the same as defined above is γ-methacryloxypropyl tris(hydrodimethylsiloxy)silane, and said mercaptoalkylalkoxysilane is a γ-mercaptopropyl trialkoxysilane.

6. The curable organopolysiloxane composition of claim 1, wherein the refractive index of said composition is no less than 1.45, and light transmittance in a cured body of said composition is within the range of 90 to 100% measured at 25° C. at a wavelength of light of 450 nm.

7. A method of curing the curable organopolysiloxane composition of claim 1 comprising a first stage of curing said curable organopolysiloxane composition to form an incompletely cured gel-like body and then a second stage for completing the curing operation by holding the obtained body at a higher temperature than the temperature at the first stage.

8. The method of claim 7, wherein a curing temperature in the first stage does not exceed 100° C.

9. A semiconductor device, wherein a light-transmitting portion of said device is formed from a light-permeable cured body of a curable organopolysiloxane composition according to claim 1.

10. The curable organopolysiloxane composition of claim 2, wherein the refractive index of said composition is no less than 1.45, and light transmittance in a cured body of said composition is within the range of 90 to 100% measured at 25° C. at a wavelength of light of 450 nm.

11. The curable organopolysiloxane composition of claim 3, wherein the refractive index of said composition is no less than 1.45, and light transmittance in a cured body of said composition is within the range of 90 to 100% measured at 25° C. at a wavelength of light of 450 nm.

12. The curable organopolysiloxane composition of claim 3, wherein in said component (B) more than 20 mole % of $R^1$ are phenyl groups.

13. The curable organopolysiloxane composition of claim 12, wherein the refractive index of said composition is no less than 1.45, and light transmittance in a cured body of said composition is within the range of 90 to 100% measured at 25° C. at a wavelength of light of 450 nm.

14. The curable organopolysiloxane composition of claim 1, wherein said vinyl monomer (c) having in one molecule a hydrosilyl group is represented by the following formula: $XSi[OSiH(R^3)_2]_g[OSi(R^3)_3]_h(R^4)_i$ wherein X is a radical-polymerizable vinyl-bond-containing group, $R^3$ is an aryl group or alkyl group with 1 to 10 carbon atoms, $R^4$ is an alkoxy group, an aryl group, or an alkyl group with 1 to 10 carbon atoms, "g" is an integer within the range of 1 to 3, "h" and "i" are integers within the range of 2 to 0, and $g+h+i=3$; and said chain-transfer agent (d) is a mercapto-containing organic silicon compound or an organic mercaptan.

15. The curable organopolysiloxane composition of claim 14, wherein (a) is an acrylic acid alkyl ester or a methacrylic acid alkyl ester, (b) is an epoxy-substituted alkyl ester of a methacrylic acid, and/or an alkoxysilyl alkyl ester of a methacrylic acid, (c) is a compound wherein one hydrogen atom in an alkyl group of a methacrylic acid alkyl ester is substituted with the group of the following formula: $-Si[OSiH(R^3)_2]_g[OSi(R^3)_3]_h(R^4)_i$ where $R^3$, $R^4$, "g", "h", and "i" are the same as defined above, and said chain-transfer agent (d) comprises said mercapto-containing organic silicon compound wherein said mercapto-containing organic silicon compound is a mercaptoalkylalkoxysilane.

16. The curable organopolysiloxane composition of claim 15, wherein said acrylic acid alkyl ester is an acrylic acid n-butyl ester and said methacrylic acid alkyl ester is a methacrylic acid n-butyl ester, said epoxy-substituted alkyl ester of a methacrylic acid is a glycidylmethacrylate, said alkoxysilyl alkyl ester of a methacrylic acid is a γ-methacryloxypropyl trialkoxysilane, said compound wherein one hydrogen atom in the alkyl group of the methacrylic acid alkyl ester is substituted with a group of the following formula: —Si[OSiH$(R^3)_2]_g$[OSi $(R^3)_3]_h$ $(R^4)_i$ where $R^3$, $R^4$, "g", "h", and "i" are the same as defined above is γ-methacryloxypropyl tri(dimethylhydrogensiloxy)silane, and said mercaptoalkylalkoxysilane is a γ-mercaptopropyl trialkoxysilane.

* * * * *